(12) United States Patent
Hayat et al.

(10) Patent No.: US 9,354,113 B1
(45) Date of Patent: May 31, 2016

(54) IMPACT IONIZATION DEVICES UNDER DYNAMIC ELECTRIC FIELDS

(75) Inventors: Majeed M. Hayat, Albuquerque, NM (US); John P. David, Sheffield (GB); Sanjay Krishna, Albuquerque, NM (US); Luke F. Lester, Albuquerque, NM (US); David A. Ramirez, Albuquerque, NM (US); Payman Zarkesh-Ha, Albuquerque, NM (US)

(73) Assignees: STC.UNM, Albuquerque, NM (US); The University of Sheffield, Sheffield (GB)

( * ) Notice: Subject to any disclaimer, the term of this patent is extended or adjusted under 35 U.S.C. 154(b) by 1146 days.

(21) Appl. No.: 13/289,645

(22) Filed: Nov. 4, 2011

Related U.S. Application Data

(60) Provisional application No. 61/456,455, filed on Nov. 5, 2010.

(51) Int. Cl.
 *G01J 1/46* (2006.01)
(52) U.S. Cl.
 CPC .......................................... *G01J 1/46* (2013.01)
(58) Field of Classification Search
 CPC ............................................................ G01J 1/46
 USPC .................................................. 702/86, 179
 See application file for complete search history.

(56) References Cited

U.S. PATENT DOCUMENTS

| 4,963,727 | A | | 10/1990 | Cova | |
|---|---|---|---|---|---|
| 5,721,424 | A | * | 2/1998 | Price | 250/214 R |
| 6,043,480 | A | * | 3/2000 | Sakamoto et al. | 250/214 A |
| 6,218,657 | B1 | * | 4/2001 | Bethune et al. | 250/214 R |
| 7,271,405 | B2 | | 9/2007 | Krishna et al. | |
| 2005/0222814 | A1 | * | 10/2005 | Nicholls et al. | 702/185 |
| 2005/0286910 | A1 | * | 12/2005 | Wernlund et al. | 398/202 |
| 2012/0168612 | A1 | * | 7/2012 | Kardynal et al. | 250/214 R |

FOREIGN PATENT DOCUMENTS

CN 1124654 C * 10/2003

OTHER PUBLICATIONS

Attaluri, R. S., et al., "Effects of Si doping on normal incidence in AS/In$_{0.15}$Ga$_{0.85}$As dots-in-well quantum dot infrared photodetectors", *Journal of Applied Physics*, 99, 083105, (2006), 1-3.

Attaluri, R. S., "Resonant cavity enhanced in As/In$_{0.15}$Ga$_{0.85}$As dots-in-a-well quantum dot infrared photodector", *Journal of Vacuum Science& Technology B*, 25, (2007), 1186-1190.

Campbell, J. C., et al., "High-Speed, Low-Noise Avalanche Photodiodes", *Optical Fiber Communications Conference (OFC 2000)*, (2000), 114-116.

(Continued)

*Primary Examiner* — Sujoy Kundu
*Assistant Examiner* — Ricky Ngon
(74) *Attorney, Agent, or Firm* — Schwegman Lundberg & Woessner, P.A.

(57) ABSTRACT

Apparatus, systems, and methods relate to use of a time-varying bias for application to an avalanche photodiode. Embodiments include systems and methods of determining an appropriate time-varying bias for application to an avalanche photodiode in linear mode. Avalanche photodiode having appropriate parameters may also be determined. Additional apparatus, systems, and methods are disclosed.

19 Claims, 12 Drawing Sheets

(56) References Cited

OTHER PUBLICATIONS

Campbell, Joe C., et al., "Recent Advances in Avalanche Photodiodes", *IEEE Journal of Selected Topics in Quantum Electronics*, 10(4), (2004), 777-787.

Choi, Byonghyok, et al., "Computation of Bit-Error Probabilities for Optical Receivers using Thin Avalanche Photodiodes", *IEEE Communications Letters*, 10(1), (Jan. 2006), 56-58.

Cook, L. W., et al., "Electron and hole impact ionization coefficients in InP determined by photomultiplication measurements", *Applied Physics Letters*, 40(7), (1982), 589-591.

Cova, S., et al., "Active-Quenching and Gating Circuits for Single-Photon Avalanche Diodes (SPADs)", *IEEE Transactions on Nuclear Science*, vol. NS-29, No. 1, (Feb. 1982), 599-601.

Cova, S., et al., "Avalanche photodiodes and quenching circuits for single-photon detection", *Applied Optics*, 35(12), (1996), 1956-1976.

David, J. P. R., et al., "Material Considerations for Avalanche Photodiodes", *IEEE Journal of Selected Topics in Quantum Electronics*, 14(4), (2008), 998-1009.

Dente, Gregory' C., et al., "Pseudopotential methods for superlattices: Applications to mid-infrared semiconductor", *Journal of Applied Physics*, 86(3), (1999), 1420-1429.

Gnauck, A. H., et al., "2.5 and 10 Gb/s Transmission Experiments Using a 137 Photon/Bit Erbium-Fiber Preamplifier Receiver", *IEEE Photonics Technology Letters*, 4(1), (Jan. 1992), 80-82.

Goh, Y. L., et al., "Excess Avalanche Noise in $In_{0.52}Al_{0.48}As$", *IEEE Journal of Quantum Electronics*, 43(6), (Jun. 2007), 503-507.

Goh, Y. L., et al., "Excess Noise and Avalanche Multiplication in InAlAs", Proceedings of *IEEE Laser and Electro Optics Society, LEOS*, (2006), 787-788.

Gunapala, S. D., et al., "640×512 pixels Long-Wavelength Infrared (LWIR) Quantum Dot Infrared Photodetector (QDIP) imaging focal plane arrary", *Sensors, Systems, and Next-Generation Satellites X, Proc. of SPIE*—vol. 6361, (2006), 1-3.

Gunapala, S. D., et al., "Demonstration of 640×512 Pixels Long-Wavelength Infrared (LWIR) Quantum Dot Infrared Photodector (QDIP) Focal Plane Arrary", *Quantum Sensing and Nanophotonic Devices IV, Proceedings of SPIE*—vol. 6479, (2007), 9 pgs.

Gunapala, S. D., et al., "Long-Wavelength Infrared (LWIR) Quantum Dot Infrared Photodector (QDIP) Focal Plane Array", *Infrared Technology and Applications XXXII, Proceedings of SPIE*, vol. 6206, (2006), 1-10.

Gunapala, Sarah D., et al., "640×512 Pixels Long-Wavelength Infrared (LWIR) Quantum-Dot Infrared Photodetector (QDIP) Imaging Focal Plane Arrary", *IEEE Journal of Quantum Electronics*, 43(3), (Mar. 2007), 230-237.

Hayat, M. M., et al., "Boundary Effects on Multiplication Noise in Thin Heterostructure Avalanche Photodiodes: Theory and Experiment", *IEEE Transactions on Electron Devices*, 49(12), (Dec. 2002), 2114-2123.

Hayat, Majeed M., et al., "A New Approach for Computing the Bandwidth Statistics of Avalanche Products", *IEEE Transactions on Electron Devices*, 47(6), (2000), 1273-1279.

Hayat, Majeed M., et al., "Effect of Dead Space on Gain and Noise in Si and GaAs Avalanche Photodiodes", *IEEE Journal of Quantum Electronics*, 28(5), (1992), 1360-1365.

Hayat, Majeed M., et al., "Effect of Dead Space on Gain and Noise of Double-Carrier-Multiplication Avalnche Photodiodes", *IEEE Transactions on Electron Devices*, 39(3), (1992), 546-552.

Hayat, Majeed M., et al., "Gain-Bandwidth Characteristics of Thin Avalanche Photodiodes", *IEEE Transactions on Electron Devices*, 49(5), (May 2002), 770-781.

Hayat, Majeed M., et al., "High Speed Heterostructure Avalanche Photodiodes", *Active and Passive Optical Components for WDM Communications III, Proceedings of the SPIE*—vol. 5246, (2003), 400-408.

Hayat, Majeed M., "Statistical Properties of the Impulse Response Function of Double Carrier Multiplication Avalanche Photodiodes Including the Effect of Dead Space", *IEEE Journal of Lightwave Technology*, 10(10), (1992), 1415-1425.

Helinski, Ryan, et al., "A Linear Digital VCO for Clock Data Recovery (CDR) Applications", *IEEE International Conference on Electronics (ICECS 2010)*, (2010), 98-101.

Kagawa, Toshiaki, et al., "An InGaAs/InAlAs Superlattice Avalanche Photodiode with a Gain Bandwidth Product of 90 GHz", *IEEE Photonics Technology Letters*, 3(9), (1991), 815-817.

Kang, Yimin, et al., "Monolithic germanium/silicon avalanche photodiodes with 340 GHz gain-bandwidth", *Nature Photonics*, vol. 3, (Jan. 2009), 59-63.

Kasper, Bryon L., et al., "Multigigabit-per-Second Avalanche Photodiode Lightwave Receivers", *Journal of Lightwave Technology*, vol. LT-5, No. 10, (1987), 1351-1364.

Kinsey, G. S., et al., "High-Speed Waveguide Avalanche Photodetectors", Proceedings *IEEE Device Research Conference*, (2001), 149-150.

Kinsey, G. S., et al., "Waveguide Avalanche Photodiode Operating at 1.55 µm with a Gain-Bandwidth Product of 320 GHz", *IEEE Photonics Technology Letters*, 13(8), (2001), 842-844.

Krishna, Sanjay, et al., "Quantum Dot Based Infrared Focal Plane Arrays", *Proceedings of the IEEE*, 95(9), (Sep. 2007), 1838-1852.

Kwon, Oh-Hyun, et al., "Enhanced Gain-Bandwidth Product and Performance in Thin Heterostructure Avalanche Photodiodes", *Proceedings of the IEEE Lasers and Electro-Optics Society (LEOS) Annual Meeting*, (2003), 997-998.

Kwon, Oh-Hyun, et al., "Gain-Bandwidth Product Optimization of Heterostructure Avalanche Photodiodes", *Journal of Lightwave Technology*, 23(5), (May 2005), 1896-1906.

Lee, S. C., et al., "Light coupling through a plasmonic antenna integrated on an InAs/GaAs quantum dot infrared photodetector", *19th Annual Meeting of the IEEE Lasers and Electro-Optics Society, (LEOS 2006)*, (2006), 250-251.

Makita, Kikuo, et al., "40Gbps Waveguide Photodiodes", *NEC J. of Adv. Tech.*, (2005), 234-240.

Nakata, T., et al., "InAlAs avalanche photodiodes with very thin multiplication layer of 0.1.um for high-speed and low-voltage-operation optical receiver", *Electronics Letters*, 36(21), (2000), 1807-1809.

Nakata, Takeshi, et al., "Multiplication Noise Characterization of InAlAs-APD with Heterojunction", *IEEE Photonics Technology Letters*, 21(24), (2009), 1852-1854.

Ng, J. S., et al., "Effect of Dead Space on Avalanche Speed", *IEEE Transactions on Electronic Devices*, 49(4), (Apr. 2002), 544-549.

Ng, J. S., et al., "Effect of Impact Ionization in the InGaAs Absorber on Excess Noise of Avalanche Photodiodes", *IEEE Journal of Quantum Electronics*, 41(8), (Aug. 2005), 1092-1096.

Ng, J. S., et al., "Field Dependence of Impact Ionization Coefficients in $In_{0.53}Ga_{0.47}As$", *IEEE Transactions on Electron Devices*, 50(4), (Apr. 2003), 901-905.

Ong, Daniel S. G., et al., "Optimization of InP APDs for High Speed Lightwave Systems", *Journal of Lightwave Technology*, 27(15), (2009), 3294-3302.

Osaka, Fukunobu, et al., "Electron and hole ionization coefficients in (100) oriented Ga0.18In0.18N0.82As0.39P0.61", *Appl. Phy. Lett.*, 45(6), (1984), 654-656.

Osaka, Fukunobu, et al., "Electron and hole ionization coefficients in (100) oriented Ga0.33In0.67As0.70P0.30", *Applied Physics Letters*, 45, (1984), 292-293.

Plimmer, S. A., et al., "Impact ionization probabilities as functions of two-dimensional space and time", *Journal of Applied Physics*, 89(5), (2001), 2742-2751.

Saleh, Mohammad A., et al., "Dead-Space-Based Theory Correctly Predicts Excess Noise Factor for Thin GaAs and AlGaAs Avalanche Photodiodes", *IEEE Transactions on Electron Devices*, 47(3), (Mar. 2000), 625-633.

Saleh, Mohammed A., et al., "Impact-Ionization and Noise Characteristics of thin III-V Avalanche Photodiodes", *IEEE Transactions on Electron Devices*, 48(12), (Dec. 2001), 2722-2731.

Shao, Jiayi, et al., "Demonstration of a Novel Mid Infrared Device: The Quantum-Dot Avalanche Photodiode (QDAP)", *2006 IEEE LEOS Annual Meeting Conference Proceedings*, (2006), 114-115.

(56) References Cited

OTHER PUBLICATIONS

Shimizu, S., et al., "40 Gbit/s waveguide avalanche photodiode with p-type absorption layer and thin InAlAs multiplication layer", *Electronics Letters*, 43(8), (2007), 476-477.

Srinivasan, Kartik, et al., "Single quantum dot spectroscopy using a fiber taper waveguide near-field optic", *Applied Physics Letters*, 91, 091102, (2007), 1-3.

Sun, P., "Correlation Between Gain and Buildup-Time Fluctuations in Ultrafast Avalanche Photodiodes and Its Effect on Receiver Sensitivity", *Optical Fiber Communication Conference, 2005. Technical Digest. OFC/NFOEC*, (2005), 3 pgs.

Sun, Peng, "A Linear Equalizer for High-Speed APD-Based Integrate-and-Dump Receivers", *IEEE Communications Letters*, 9(12), (Dec. 2005), 1073-1075.

Sun, Peng, et al., "Decision-Feedback and Transversal Equalization for High-Speed APD-Based Receivers", *SPIE Symposium on Optics East, Optoelectronic Devices: Physics, Fabrication, and Application III*, (2006), 1-3.

Sun, Peng, et al., "Statistical Correlation of Gain and Buildup Time in APDs and Its Effects on Receiver Performance", *Journal of Lightwave Technology*, 24(2), (2006), 755-768.

Tan, C. H., et al., "Potential Materials for Avalanche Photodiodes Operating above 10Gb/s", *2009 International Conference on Computers and Devices for Communication*, (2009), 1-6.

Tan, C. H., et al., "The effect of dead space on gain and excess noise in $In_{0.38}Ga_{0.52}P^{+}in_{+}$diodides", *Semicond. Sci. Technol.*, 18, (2003), 803-806.

Varley, E., et al., "Single bump, two-color quantum dot camera", *Applied Physics Letters*, 91 081120, (2007), 1-3.

Wang, S., et al., "Low-Noise Avalanche Photodiodes with Graded Impact-Ionization-Engineered Multiplication Region", *IEEE Photonics Technology Letters*, 13(12), (Dec. 2001), 1346-1348.

Wang, S., et al., "Low-Noise Impact-Ionization-Engineered Avalanche Photodiodes Grown on InP Substrates", *IEEE Photonics Technology Letters*, 14(12), (Dec. 2002), 1722-1724.

Wang, Shuling, et al., "Ultra-Low Nosie Avalanche Photodiodes with a "Centered-Wall" Multiplication Region", *IEEE Journal of Quantum Electronics*, 39(2), (Feb. 2003), 375-378.

Yasuoka, Nami, et al., "Large Multiplication-Bandwidth Products in APDs with a Thin InP Multiplication Layer", *The 16th Annual Meeting of the IEEE Lasers and Electro-Optics Society, (LEOS 2003)*, (2003), 999-1000.

Yuan, P., et al., "Avalanche Photodiodes with an Impact-Ionization-Engineered Multiplication Region", *IEEE Photonics Technology Letters*, 12(10), (Oct. 2000), 1370-1372.

Zaoui, Wissem S., et al., "Frequency response and bandwidth enhancement in Ge/Si avalanche photodiodes with over 840GHz gain-bandwidth-product", *Optics Express*, 17(15), (2009), 12641-12649.

"New Focus Internet Home Page", [online]. [archived on Feb. 2, 2010]. Retrieved from the Internet: <https://web.archive.org/web/20100202032807/http://www.newfocus.com/>, (Feb. 2, 2010), 1 pg.

Gunapala, S., et al., "Demonstration of 640×512 pixels long-wavelength infrared (LWIR) quantum dot infrared photodetector (QDIP) imaging focal plane array", *Infrared Physics & Technology*, 50(2-3), (2007), 149-155.

Kwon, Ohhyun, "Modeling and Optimization of Heterojunction Avalanche Photodiodes: Noise, Speed and Breakdown", (Abstract), Thesis, Ph.D, Dissertation, University of New Mexico, (Dec. 2004), 9 pgs.

Sun, Peng, "Mathematical Theory of Modern Avalanche Photodiodes and Its Application to Ultrafast Communications", Thesis, Ph.D, Dissertation. University of New Mexico, (May 2008), 111 pgs.

\* cited by examiner

IMPACT IONIZATION DEVICES UNDER DYNAMIC ELECTRIC FIELDS

RELATED APPLICATION

This application claims priority under 35 U.S.C. 119(e) from U.S. Provisional Application Ser. No. 61/456,455, filed 5 Nov. 2010, which application is incorporated herein by reference in its entirety.

GOVERNMENT INTEREST STATEMENT

This invention was made with Government support under Grant: National Science Foundation (NSF) EEC0812056. The United States Government has certain rights in the invention.

FIELD OF THE INVENTION

The invention relates generally to optoelectronic devices and methods of their operation.

BACKGROUND

To meet the demands of the exponential growth in video, voice, data, and mobile-device traffic over the Internet, the telecommunication industry has been moving toward 40-Gbps and 100-Gbps data rates for their core fiber-optic backbone networks alongside the existing 10-Gbps infrastructure, which operates at the low-loss wavelength window of 1.55 μm. Many of the modulation techniques that are effective at these high speeds (for example, being tolerant to polarization-mode dispersion, chromatic dispersion, and intersymbol interference (ISI), as well as having competitive edge in price and performance combination) require receivers that are based upon the direct detection of optical pulses. These techniques include phase-shaped binary transmission (PSBT) or duo-binary modulation (DM), return-to-zero on-off-keying (RZ-OOK), and carrier-suppressed return-to-zero (CS-RZ). Typically, such high-speed operation uses high sensitivity detectors.

Separate absorption and multiplication (SAM) InP-InGaAs avalanche photodiodes (APDs) are normally the most preferred photodetectors for direct-detection high-data rate systems for two main reasons. First, they have high sensitivity, which results from the internal gain they generate. The gain is the total number of carriers generated through an avalanche of impact ionizations in response to a single carrier excitation. Second, they are highly cost effective compared to receivers that employ optical pre-amplification. Indeed, SAM InP-InGaAs APDs have been deployed in support of the synchronous optical networking (SONET) standards of OC-48 and OC-192, which operate at 2.5 Gbps and 10 Gbps, respectively. However, the long avalanche buildup time in InP, which is the time needed for all the impact ionizations to settle, has limited the speed of InP-based APDs and stopped them from meeting the expectations of 40-Gbps systems. There are few or no commercial APDs available for 40-Gbps communication, despite numerous efforts in the past two decades or so which targeted new APD materials and structures.

Viable options for direct detection of 40-Gbps bit streams include InGaAs PIN photodiodes, since very high bandwidths can be achieved with such state-of-the-art PIN photodiodes. However, PIN photodiodes have lower sensitivity than APDs since they do not offer any internal gain. To detect weak signals in the increased presence of Johnson noise in high data-rate systems, where increasing the bit rate by a factor of four causes the Jonson noise to increase by 6 dB, erbium doped fiber amplifiers (EDFAs) are typically used to pre-amplify the signals optically before their detection by the PIN photodiode. The resulting EDFA-PIN receiver can exhibit very high sensitivity (<−30 dBm), due to EDFA's high gain and low noise, as well as high speed, which is due to the high bandwidth of the PIN photodiode. However, these receivers can be bulky and expensive. An EDFA uses meters of fiber, which are generally coiled in a fairly sizeable disk, and more importantly, it uses a pump laser, which provides the optical amplification. For example, a 40-Gbps EDFA-InGaAs-based receiver module may cost up to $5,000. In contrast, APD-based receivers, which run for about $500, benefit from small form-factor packaging, since they can easily be integrated with the electronic components of the receiver circuit, and would offer a much more cost-effective solution than the EDFA-PIN receiver only if their speed were to be improved. Since ultra-low-noise APDs have already been demonstrated, the persisting challenge is the development of 1.55 μm APDs that can reliably offer gain-bandwidth-products (GBPs) in excess of 350 GHz, for example offering a gain of 10 at a speed of 35 GHz.

The long avalanche buildup time in InP is due to its roughly equal electron and hole ionization rates, where the hole-to-electron ionization coefficient ratio, k, is in the range 2.5-4 for InP. Moreover, the buildup time scales with the gain. Specifically, the buildup time limits the bandwidth at values of the gain (>10) that are useful in Johnson noise suppression. FIG. 1 shows a schematic illustrating the cascade of impact ionizations and the associated buildup time in a multiplication region of an APD such as an InP APD. Specifically, as a parent hole 102 is generated in an absorption layer (not shown), such as an InGaAs absorption layer, and injected in the InP multiplication region (parent hole 102 is shown at the bottom of the structure), a first wave of impact ionizations take place. The parent hole injected at the bottom initiates the avalanche. While the offspring holes drift together and reach the end of the multiplication region, the offspring electrons, which will still be present in the multiplication region, move in the opposite direction, as shown in the FIG. 1, causing a second-wave of impact ionizations. After the second wave ends, a third wave is launched, and so on, until eventually the impact ionization process ceases when all charge carriers exit the depletion layer, which is an intrinsic layer. The avalanche process includes hole ionization 101 and electron ionization 103. These ionizations provide a pulse 107 due to holes and a pulse 109 due to electrons, where the two pulses provide a total avalanche pulse 108. Number, locations, and times of impact ionizations are random, and the resulting avalanche pulse, where each drifting carrier contributes to the avalanche pulse, is therefore stochastic, with area representing the stochastic gain. The first wave refers to the carriers born in the first electron transit time, the second wave refers to those created in the hole transit time following the first electron transit time, and so on.

Indeed, the GBP of InGaAs/InP APDs has been limited to 170 GHz, which corresponds to a gain value below 5 if the bandwidth is constrained to a minimum value of 35 GHz in support of 40 Gbps bit rates. With such low gain, the APD cannot compete with the much faster PIN photodiodes combined with a high-gain (~20 dB) EDFA.

There have been numerous efforts in the past two decades to explore new materials or new device concepts to overcome current limitations of InP and InAlAs APDs. For example, there have been efforts to engineer the multiplication region to minimize multiplication noise and maximize the GBP. Of particular importance is the discovery in the mid-1990s that submicron scaling of the multiplication region thickness leads to lower multiplication noise and higher gain-bandwidth products. In fact, the highest value of a commercial InGaAs/InP APD, 170 GHz, utilizes a very thin InP multiplication layer of 80 nm. Other efforts involved impact-ionization engineering of heterojunction multiplication regions, edge-illuminated and evanescently coupled waveguide structures, and use of $In_{0.52}Al_{0.48}As$ material for multiplication. The k factor in $In_{0.52}Al_{0.48}As$ is k=4-6.7, which gives it an edge over InP in terms of noise and GBP. InAlAs-based APDs have showed GBPs ranging from 70 to 170 GHz with the exception of two reported results with values of 290 GHz in 2000 and 320 GHz in 2001. It is now accepted that while both InP and InAlAs APDs have sufficient bandwidth to support 10-Gbps transmission, they cannot sustain gain-bandwidth tradeoff for 40 Gbps. A sensitivity of −19 dBm at 40 Gbps with a bit error rate of $10^{-10}$ has been demonstrated, providing approximately a 9 dB improvement over conventional PIN diode. This sensitivity was achieved by including a transimpedance amplifier with tunable response to boost the GBP from 140 to 270 GHz and by operating the APDs with avalanche gain values of 3 to 10. More recently, it was reported that that a Ge absorption layer grown directly on a Si multiplication layer provided a GBP of 340 GHz. This high GBP was attributed to the favorable ionization properties of Si. Most recently, Si on Ge APD with a GBP of 840 GHz operating at 1.31 µm was demonstrated. Despite all these efforts and advances, to this date there does not appear to be a commercial APD available to detect 40 Gbps signal, and the challenge is even greater for systems operating at 1.55 µm.

BRIEF DESCRIPTION OF THE DRAWINGS

Embodiments of the invention are illustrated by way of example and not limitation in the figures of the accompanying drawings in which.

DETAILED DESCRIPTION

Figure 1:
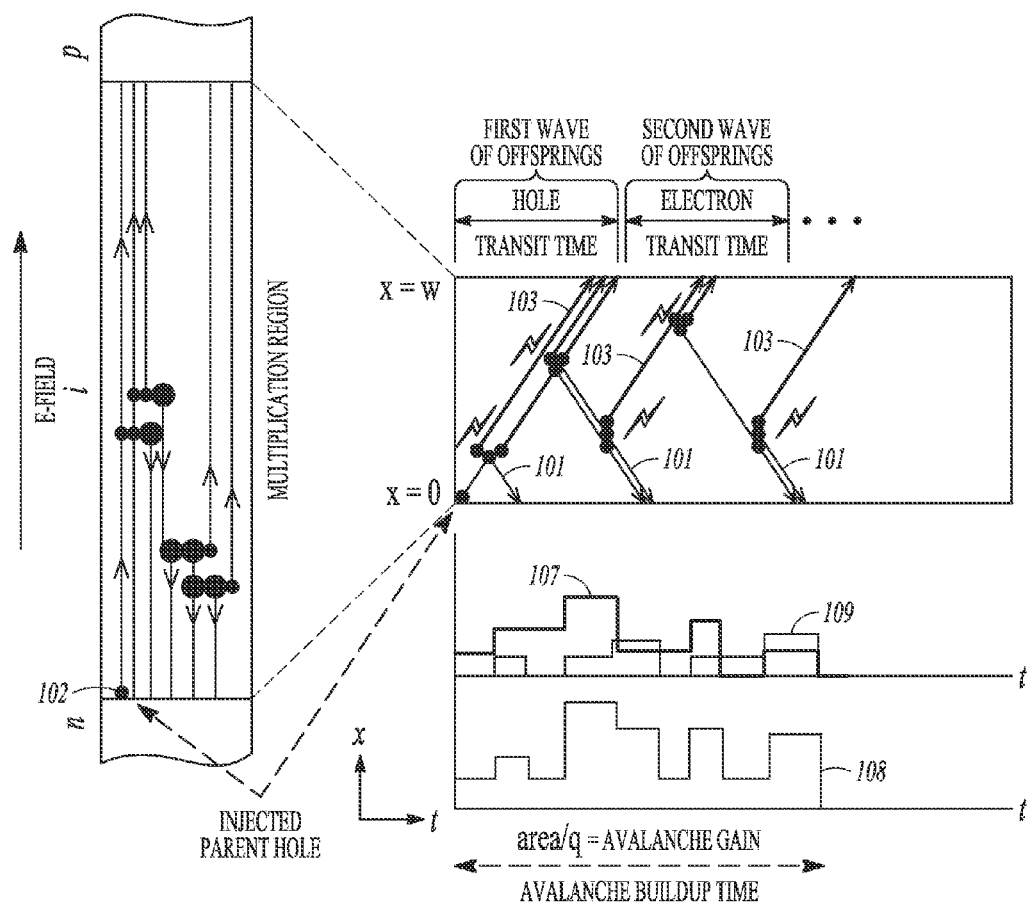
FIG. 1 depicts a schematic of the avalanche buildup time showing the cascade of impact ionizations in a multiplication region of an avalanche photodiode diode, in accordance with various embodiments.

The following detailed description refers to the accompanying drawings that show, by way of illustration and not limitation, various example embodiments of the invention. These embodiments are described in sufficient detail to enable those skilled in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, an impact ionization-aware dynamic-biasing scheme for avalanche photodiodes (APDs) can be implemented in, but not limited to, a digital communication mechanism. The impact ionization-aware dynamic-biasing scheme applied to APDs is expected to result in GBPs well above 1200 GHz and receiver sensitivities below −29 dBm for 40 Gbps digital communication and beyond. To take the speed of APD-based digital receivers to the next level, one can begin by exploring a mechanism that can, in principle, eliminate the buildup-time problem in the context of digital optical communications. If the reverse bias of the APD is able to abruptly change near the end of the optical pulse from its optimal value to a much lower value that permits no impact ionizations at all, yet photons are detected, then it would practically be quenching the APD's avalanche current in preparation for the next incoming optical pulse. The optimal value may be suitably selected to yield an optimal gain value while maintaining a low excess noise factor. For such quenching effect to materialize, the bias would need to drop in one carrier transit time at the end of the optical bit. With this approach, the speed of the APD-based receiver may be totally decoupled from the APD's gain, and the speed may be limited only by the transit time of the carriers. In fact, this is almost identical, in principle, to the approach of active quenching in single-photon avalanche diodes (SPADs), a very successful single-photon detection technique pioneered in the 1980's. However, SPAD circuits run at much slower speeds, such as pulse repetition rates in the low MHz range. Further, such periodic, abrupt transitions in the bias are not implementable at speeds of 40 GHz because of two main reasons: (1) the slew-rate limit of the driver for the bias and (2) the bandwidth limit of the electronic circuit for the bias. Nonetheless, in various embodiments, with proper selection of implementable time-varying biases in the bit duration, such as sinusoids, the active-quenching phenomenon can be approximated to elevate the APD-based receiver speed to a level comparable to that for a PIN-based receiver. The success of such approach may be addressed by implementing time-varying biasing schemes at high speeds, where modeling the impact ionization process and GBP under dynamic biasing conditions may be conducted to attain implementable dynamic-biasing schemes that yield highest GBP possible.

Figure 2:
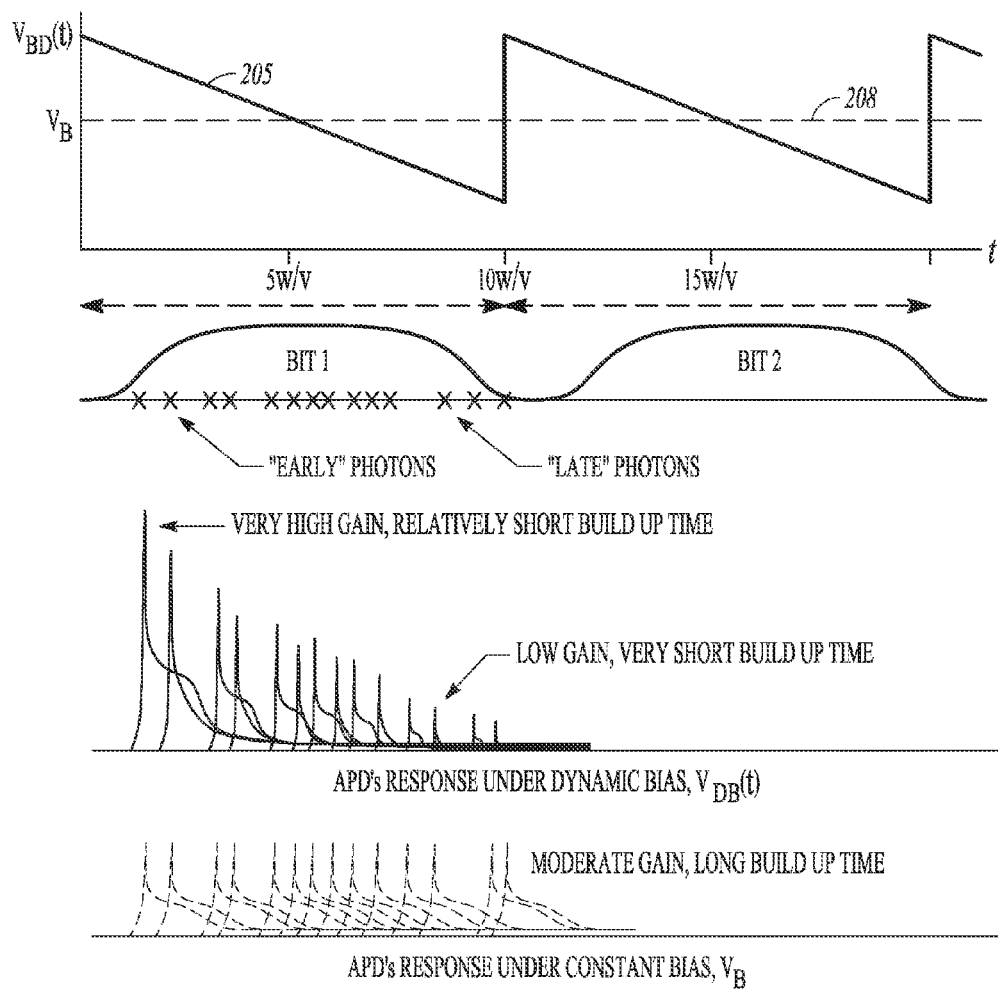
FIG. 2 shows an illustration of an example dynamic biasing scheme for an avalanche photodiode diode repeated periodically over bit-clock-synchronized intervals, in accordance with various embodiments.

FIG. 2 shows an illustration of an example embodiment of a dynamic biasing scheme 205 for an APD repeated periodically over bit-clock-synchronized intervals. The time unit w/v represents a carriers' transit time across the width of the multiplication region. Line 208 represents the traditional constant bias. The downward change in the reverse bias from the first to the second half of the bit period causes the gain and buildup times, corresponding to individual avalanche triggers, to decrease, which results in a much higher average GBP compared to the conventional biasing scheme. Ionization-aware dynamic biasing scheme 205 introduces a non-traditional, yet practical, scheme that can enable APDs to be suitable for digital 40-Gbps fiber-optic communication links and beyond. Unlike the traditional biasing scheme, where a constant dc reverse-bias is applied to the APD throughout the detection process, dynamic biasing scheme, such as ionization-aware dynamic biasing scheme 205, is based on varying the applied reverse bias during each received optical pulse (optical bit) from high to low, as schematically shown in FIG. 2.

A dynamic biasing scheme that varies an applied reverse bias during each received optical pulse includes two features. First, photons that arrive early in the optical bit result in avalanche pulses that are very strong as long as the bias is high, after which they are quenched by the low bias in the latter part of the bit period. This process may result in a very high gain for avalanches that are triggered by "early" photons, yet they may have a limited buildup time due to the quenching mechanism. Second, photons that arrive late in the received optical bit are still detected as the photodetector remains reverse biased, albeit the resulting gain is low and the buildup time is naturally very short. Through such dynamic and periodic biasing, photons arriving in each bit can collectively generate a high gain while their buildup times are dynamically controlled. As a result, a very high photon-arrival-time-averaged (PATA) GBP can be generated. In effect, the behavior of a detector structured for such dynamic biasing, which detector is termed herein dynamic-biased-enhanced APD (DBE-APD), is akin to a hypothetical bi-mode detector whereby the detector behaves like a high-gain, short-build up time APD in the first half of the bit, while it switches to a simple PIN diode in the later part of the bit. The detector in its mode as a high-gain, short-build up time APD may be considered to be similar to silicon or mercury-cadmium-telluride APDs.

It is to be noted that, while the optoelectronic gain present in the DBE-APD's photocurrent is time varying, since the APD's responsivity is time varying due to the changing reverse bias, the total charge accumulated in each bit in an integrate-and-dump receiver is not affected by the time-variant behavior of the DBE-APD. More precisely, since the photocurrent is integrated over each bit in the receiver, the total charge is simply proportional to the product of the PATA gain and the total number of photons in the optical pulse in each bit. In other words, the charge produced in each bit remains proportional, with a proportionality constant that is constant from bit to bit, to the energy in the optical pulse in each bit. Thus, while the DBE-APD may not be directly applicable to simple analog detection (unless gain equalization is employed), it is a perfect fit to digital communications. It is also to be noted that a sinusoidal-gating approach has been proposed for Geiger-mode APDs in the context of gated photon counting. However, the purpose there is to force quenching of the avalanche pulse after each detection-gate (high cycle of the sinusoidal bias) and therefore minimize the total number of multiplications, which, in turn, would reduce afterpulsing. As such, it is totally different from the linear-mode dynamic biasing approach as taught in various embodiments herein. Specifically, photon counting with the sinusoidal-gating approach is a binary detection: the APD is responsive to only one photon each gate. In contrast, in embodiments of a linear-mode dynamic biasing approach, essentially each and every photon in the optical pulse that is absorbed by the photodetector contributes to the analog photocurrent.

Figure 3:
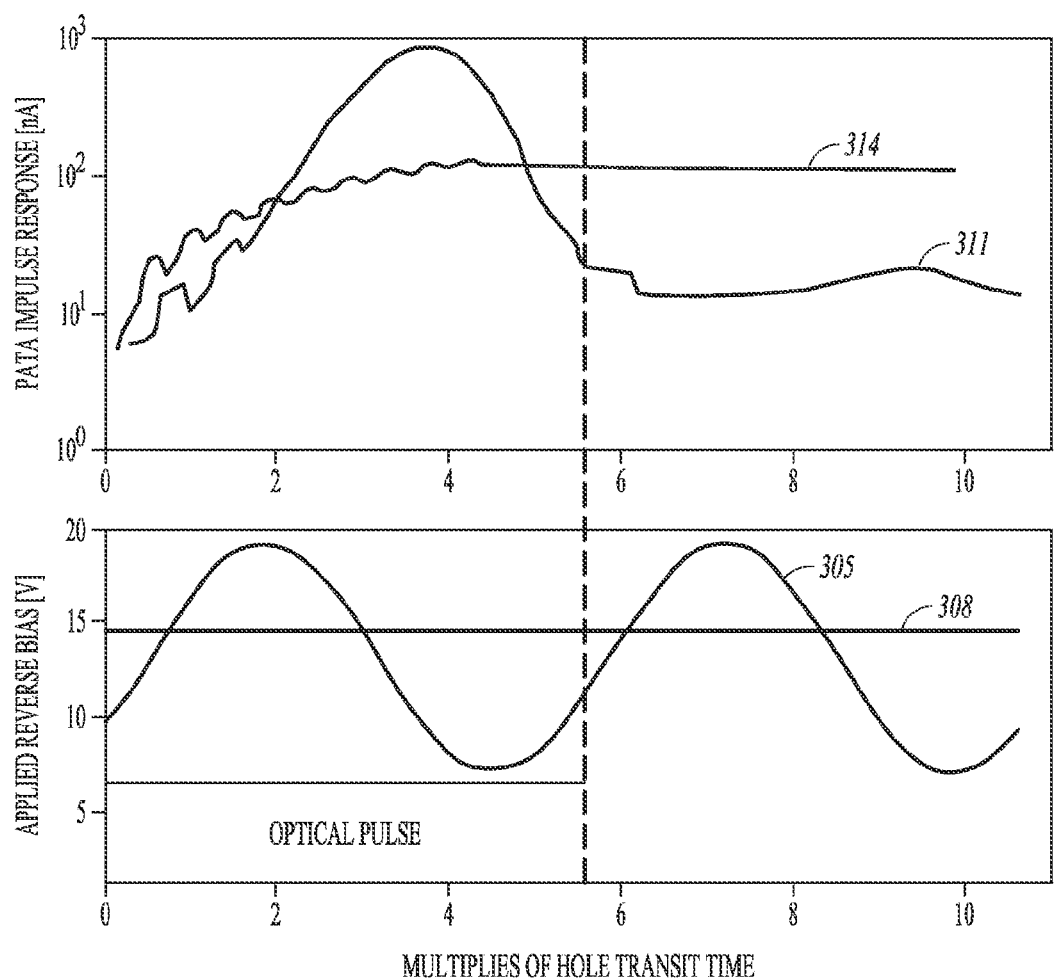
FIG. 3 shows a chart indicating the calculated time response to a rectangular optical pulse of an example dynamic-biased-enhanced avalanche photodiode diode and a conventional avalanche photodiode diode, in accordance with various embodiments.

Preliminary results from rigorous analytical modeling shows that even without any device optimization, a DBE-APD approach can increase the gain-bandwidth product of an APD by a factor of 5 compared to the same APD operated under the conventional static biasing scheme. FIG. 3 shows a chart indicating the calculated time response to an 8.3-ps rectangular optical pulse 302 of an example DBE APD and a conventional APD. As an example, an InP APD was considered for both dynamic biasing 305 and constant bias 308. A sinusoidal-dynamic bias function can be used for dynamic biasing 305. As noted, a 5X enhancement in the GBP is predicted. FIG. 3 also shows a simulated PATA mean impulse-response function 311 of a 200-nm InP APD with the sinusoidal dynamic-field profile 305 and a simulated PATA mean impulse-response function 314 of the 200-nm InP APD with the traditional constant reverse bias 308. To reiterate, the PATA response can be thought as the response of the APD to an NRZ optical pulse. The width of the optical pulse is 8.3 ps in this example, consistent with 60-Gbps NRZ bit stream. The amplitude, dc-bias, and phase shift of the sinusoidal periodic function has been selected to maximize the GBP. Calculations predict an enhancement in the buildup-time limited GBP from 238 GHz, corresponding to a mean gain of 28 and bandwidth of 8.5 GHz, in the traditional constant-bias scheme to 1169 GHz, corresponding to a PATA mean gain of 27 and PATA bandwidth of 43.3 GHz. Note that the GBP for the constant-bias scheme is larger than that normally reported for a 200-nm InP APD since only buildup-time limitations are considered here (for example, RC effects are ignored). Nonetheless, the results show an enhancement factor of 5. Even greater improvement is anticipated when the dynamic bias characteristics (for example, other implementable shapes and voltage swings) are optimized for a maximal GBP and when the multiplication region is also optimized via doping and heterostructure engineering.

The design of the dynamic biasing may be coupled with material and doping engineering of the multiplication region of the APD with the aim of simultaneously maximizing the GBP and minimizing the avalanche multiplication noise. Through judicious doping and heterostructure engineering of the multiplication region, the ionization-coefficient profile in the multiplication region can be modulated spatially so that the impact ionizations are tuned to the dynamic bias so as to maximize the GBP. Coupled bias and device design can be structured to promote the first-wave of impact ionizations while discouraging second-wave ionizations.

Figure 4:
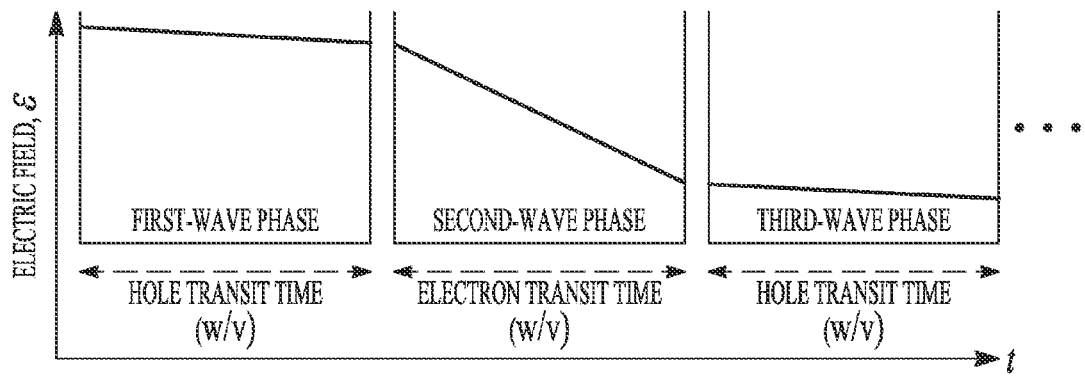
FIG. 4 shows an electric field seen by carriers from the first through third waves of impact ionization, in accordance with various embodiments.

FIG. 4 illustrates an electric field seen by carriers from the first through third waves of impact ionization. As shown in FIG. 4, appropriate doping of the multiplication region can yield an ascending electric field gradient. A constant doping is assumed in the multiplication region, which results in an ascending field gradient in the x-direction. When combined with the proposed decreasing bias, the electric field seen by odd-wave carriers becomes almost constant over their transit time while that seen by even-wave carriers are sharply decreasing. In an InP multiplication layer, this hybrid dynamic-spatial field modulation reduces the probability of impact ionization by electrons in the second-wave phase, which, in turn, helps quenching the avalanche pulse.

In the first wave of multiplications within the first hole transit time, the high dynamic bias offsets the low field in the beginning of the multiplication region, which yields an overall robust field that promotes ionizations in the first wave. As the second wave of ionizations begins, defined as the electron transit time directly following the first wave, the dynamic bias continues to drop, and, as the electrons traverse a descending field, their capability to impact ionize will deteriorate as they march toward the edge of the multiplication region. This combination discourages second-wave electrons to impact ionize and tends to break the symmetry in the hole and electron ionization coefficients that InP notoriously suffers from.

Figure 5:
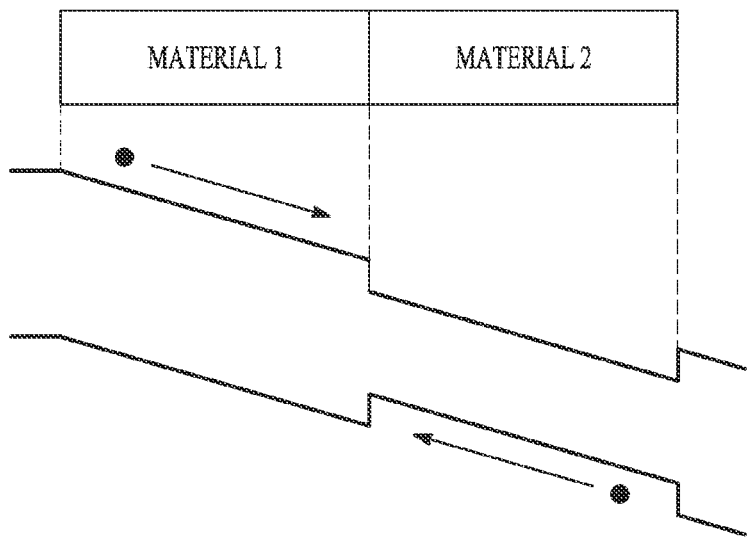
FIG. 5 shows schematics and energy band diagrams of a single-well structure, in accordance with various embodiments.

It is also possible to bandgap engineer the multiplication region to further discourage ionizations in the second and subsequent waves. FIG. 5 shows the schematics and energy band diagrams of a single-well structure. Use of an InAlAs—InAlGaAs heterostructure multiplication region for materials 1 and 2 has been proposed, where the parent hole first experiences the lower bandgap InAlGaAs material, creating a large number of impact ionizations due to the high field during this phase, and then enters the higher bandgap InAlAs material. In the second-wave phase, the electrons encounter a lower field than the electrons experience in the first-wave phase. However, these electrons also have less probability of impact ionizing due to the higher bandgap, which together with the lower field impede second-wave impact ionizations.

In various embodiments, a dynamic-biasing approach can be implemented for elevating and optimizing the performance of APDs in high-speed optical communication. This new paradigm for APD design adds a new dimension to the traditional material- and structure-based design. Much greater GBP may be achieved compared to earlier efforts, which only focused on device materials and structures. Another feature of this approach is that it is essentially APD-agnostic; that is, it can be used to improve the GBP of any APD device. As compared to conventional schemes, dynamic biasing scheme of the DBE-APD approach can provide for the relaxation of stringent requirements of the width of the multiplication region. Such relaxation may be provided in a manner as normally done to enhance the APD speed. This, in turn, reduces the electric field in the multiplication region, which reduces tunneling current, the principal component of the notorious dark current in high-speed APDs. With such performance enhancement and cost effectiveness, it is anticipated that the DBE-APD approach for digital receivers may have a huge impact on next-generation long haul and metro networks.

In various embodiments, DBE APDs and receivers can be modeled, designed, and optimized based on theoretical and simulation approaches. The result of the theoretical and simulation approaches can be applied to fabricate, characterize, and deploy DBE APDs in the form of a 40 Gbps receiver module. In the modeling and optimization of a DBE APD, a generalization of a recursive technique can be applied to include a time-varying bias of the APD. This can provide an analytical model for the mean gain, the excess noise factor, the mean impulse-response function, as well as the probability distribution function of the buildup time, under the assumption of a heterostructure multiplication region with an arbitrary electric field profile. The model can, for example, be applied to impact-ionization engineered ($I^2E$) APDs. The model captures the dead space and the initial energy effects, both of which have been shown to play a critical role in the noise and bandwidth properties of high-speed APDs with thin (<500 nm) multiplication regions. The dead space is the minimum distance a newly born (generated) carrier must travel before acquiring sufficient kinetic energy, equal to the ionization threshold energy, which enables it to effect impact ionization stochastically.

The analytical model can be used to assess the GBP performance of the DBE-APD and optimize the performance over the choice of the biasing function and the material and structure of the APD. The analytical model may also be used to generate data and/or relationships to calculate the receiver sensitivity associated with DBE-APDs such as InP DBE-APDs. The analytical receiver-sensitivity model may include the effects of ISI, avalanche noise, avalanche duration, tunneling current, and amplifier noise.

Suppose that a time-varying bias, $V_{BD}(t)$, is applied to an APD, as shown in FIG. 2, with the implicit assumption that the time reference is t=0. Consider the multiplication region of the APD, which extends from x=0 to x=w, as shown in FIG. 1, with the convention that the electric field is pointing in the positive x direction. Suppose that a parent hole (electron) is created at an arbitrary location x in the charge-depleted multiplication region, and assume that the field is sufficiently high such that conduction-band electrons and valence-band holes travel at their material-specific saturation velocities in the material. The stochastic multiplication factor is defined as the total number of electron-hole pairs generated as a result of a parent carrier. The buildup time is the time from the creation of the parent carrier to when all carriers have exited the multiplication region. Clearly, the buildup time is simply the duration of the impulse-response function. The multiplication factor, impulse-response function, and the buildup time are all stochastic, and are also dependent on the position of the birthplace of the parent carrier, and can be either finite or infinite. While Monte-Carlo and analytical models exist that describe the statistics of the impulse-response function, multiplication factor, and the buildup time in the case when the bias $V_{BD}(t)$ is a constant, there appears to be no conventional model for the case when the bias is time varying.

In a dynamic-field scenario, it turns out that the age of the carrier measured from the point in time when the dynamic bias is launched (namely, the age is measured from t=0) plays a key role in the impact ionization characteristics, based on the observation that the carriers' ionization coefficients are dependent on time as the field varies dynamically. As such, carriers born at different times will experience a dynamical electric field as they generate their own chains of offspring carriers through series of impact ionizations. Specifically, if it is assumed that a causal and spatially nonuniform electric field, E(x,t), is launched at time t=0, then a hole born at location x and at time 0 will experience this progressive field as it generates its chains of impact ionizations. On the other hand, if a hole is born at location $\xi$ and at time s (relative to t=0), it will experience the s-delayed progressive field $E(\xi, t-s)u(t-s)$, where u(•) is the unit-step function. For example, at any time $\delta s$ after time s, the electron will have an ionization coefficient, $\alpha(\xi, s+\delta s)$, signifying the position of the carrier $\xi$ and the time $s+\delta s$ elapsed since the launch of the dynamic field at t=0; namely, the electric field value governing the ionization coefficient $\alpha(\xi, s+\delta s)$ is $E(\xi, s+\delta s)$.

To take the "age" factor into account in modeling of the avalanche multiplication process, a model can be used in which the ionization probability is parameterized by the time at which the parent carrier is injected in the multiplication region. The model assumes that a parent carrier initiates the multiplication process at an arbitrary location in the multiplication region and at an arbitrary instant (age) after the launch of the dynamic bias. A set of novel recurrence equations discussed herein can be used to calculate the mean impulse-response function, the mean multiplication factor, and the excess noise factor, as a result of the parent carrier initiating the multiplication process.

Figure 6:
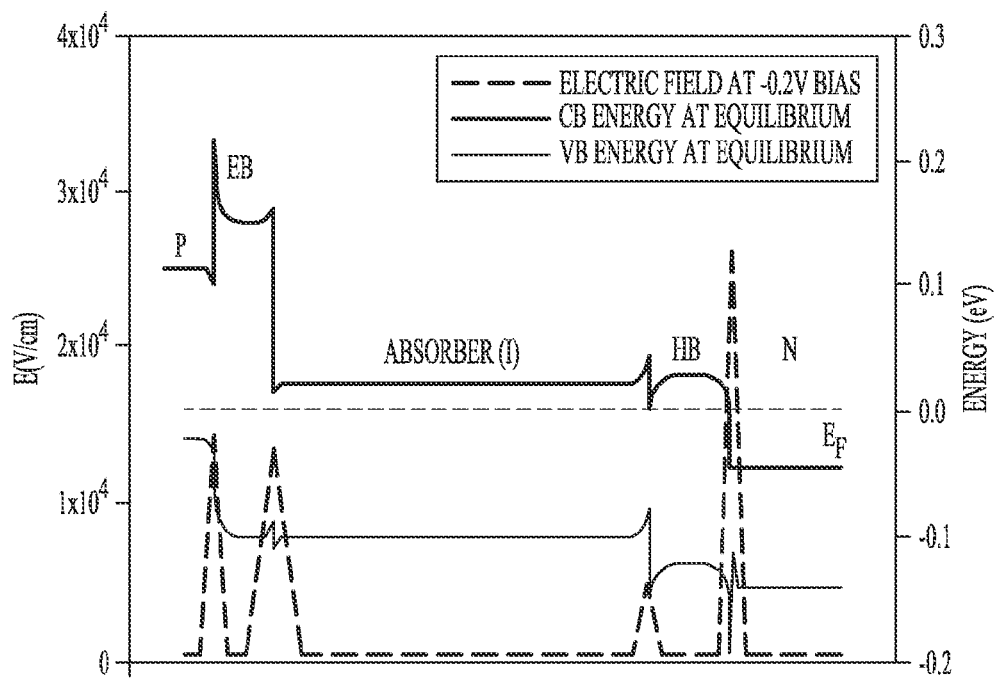
FIG. 6 shows a modeled band structure and electric field profile using a semi-empirical pseudopotential method, in accordance with various embodiments.
Figure 7:
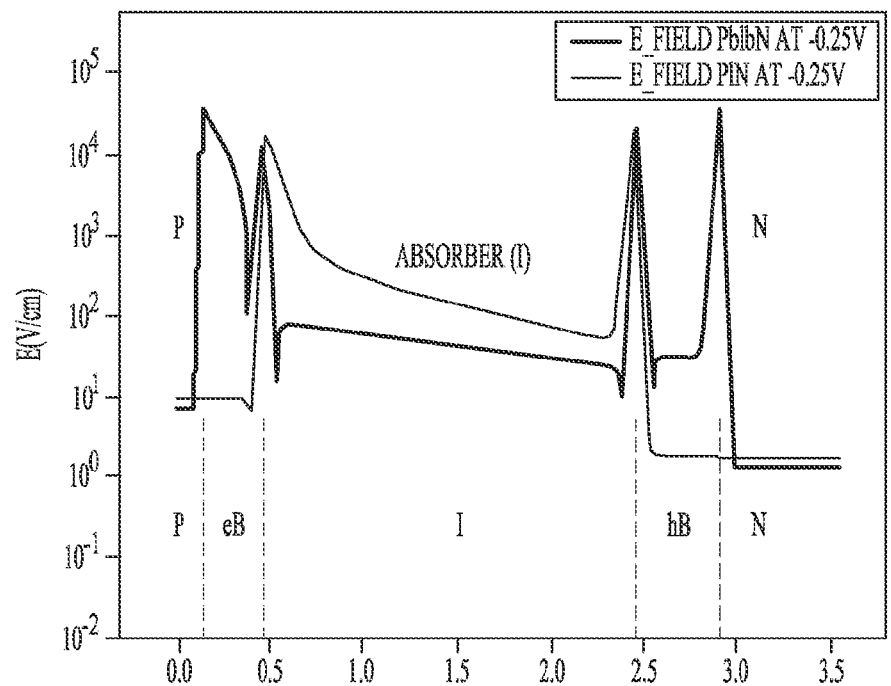
FIG. 7 shows a reduction in the electric field in the absorber of FIG. 6 using appropriately designed barrier layers, in accordance with various embodiments.

In various embodiments, an appropriate APD design can be structured based on choices of doping profile and material. A Poisson solver can be used to accurately model the electric field profile in heterostructures with different doping profiles. For example, a poison solver based on a commercial T-CAD Sentaurus platform can be used. It is suggested to implement constant and variable doping to affect the field gradients in the multiplication region of APDs, such as InAlAs—InAlGaAs APDs, and examine the best doping profile that yields the highest GBP according to the analytical recursive model. In the analysis as described earlier, an ascending field gradient from x=0 to x=w in FIG. 1 can be used. Schrodinger solvers can be used, where such Schrodinger solvers have been previously used by researchers to model the quantum effects from thin semiconductor layers and integrate these effects with various barrier and absorber regions to accurately predict the field profile in hetero structures. For example to model the electric field and band structure in thin semiconductor superlattices, band offsets and bandgaps can be obtained from a semi-empirical pseudopotential method (SEPM) with the output of this calculation provided to the Sentaurus T-CAD for further simulations. FIG. 6 shows a modeled band structure and electric field profile using the semi-empirical pseudopotential method. In the representative modeled band structure and the electric field shown in FIG. 6, unipolar barriers were used to reduce the electric field drop in the absorber region. FIG. 7 shows a reduction in the electric field in the absorber of FIG. 6 using appropriately designed barrier layers.

In various embodiments, a processing system can be structured to implement a generalized theory of avalanche multiplication under time-varying electric fields for application to optoelectronic devices arranged to be subjected to a dynamic-biasing scheme. A recurrence theory for the impulse-response function under nonuniform, static electric fields was originally formulated by one of the inventors and later extended to accommodate stochastic carrier velocity by another researcher. Such generalized recurrence theories for the mean impulse response can be adjusted to include dynamic fields. This adjusted generalization can be termed the age-dependent recursive theory for avalanche multiplication. An outline of the formulation of the age-dependent recursive theory for avalanche multiplication is provided in the following discussion. Assume that at time t=0, a spatially nonuniform, dynamic-field profile E(x,t) is launched in the multiplication region of an APD. Assume that a parent carrier is created in the multiplication region at location x with an age s, measured from the time origin at t=0. Begin by defining, $I_e(t,x,s)$, the stochastic impulse-response function at t, initiated by an electron injected at location x with age s. Similarly, $I_h(t, x, s)$ is the stochastic impulse-response function at t, initiated by a hole injected at location x with age s. The age variable s can also be associated with the absorption time of a photon, which results in a photo-generated parent carrier.

The rationale for the age-dependent recurrence theory is also based on stochastic renewal. To implement the stochastic renewal, the appropriately time-dependent field evolution, namely $E(\xi,t-s)u(t-s)$, associates to every time of birth s and birth location. A renewal argument is raised that will allow recursive characterization of the means of $I_e(t,x,s)$ and $I_h(t,x,s)$. Suppose that a parent electron at x impact ionizes for the first time at location $\xi > x$. A key observation is that at the time just after this first ionization, there will be two freshly born electrons at $\xi$ (the re-born parent electron and its offspring) and a freshly born hole also at $\xi$ (parent electron's hole offspring). Each of these two electrons at $\xi$ will independently instigate a statistically equivalent multiplication process similar to the one originated by the parent electron at location x, with $v_e$ being electron velocity, albeit their age is not s but instead it is $s+(\xi-x)/v_e$, which is the age of the original electron plus the time it took it to undergo its first ionization at $\xi$. A similar argument can be made for the offspring hole.

If $i_e(t,x,s)$ and $i_h(t,x,s)$ are defined as the mean quantities of $I_e(t,x,s)$ and $I_h(t,x,s)$, respectively, then the recursion can be obtained (omitting the mathematical derivation)

$$i_e(t,x,s)=[1-(qv_e/w)u(t-(w-x)/v_e)]\int_w^\infty h_e(\xi;x,s)d\xi + \int_x^{min(w,x+v_e t)}[2i_e(t-(\xi-x)/v_e,\xi,s+(\xi-x)/v_e)+i_h(t-(\xi-x)/v_e,\xi,s+(\xi-x)/v_e)]h_e(\xi;x,s)d\xi$$

A similar equation can be obtained for $i_h(t,x,s)$ with $v_h$ being hole velocity:

$$i_h(t,x,s)=[1-(qv_h/w)u(t-x/v_h)]\int_x^\infty h_e(\xi;x,s)d\xi + \int_0^{min(w,x+v_h t)}[2i_h(t-(x-\xi)/v_h,\xi,s+(x-\xi)/v_h)+i_h(t-(x-\xi)/v_h,\xi,s+(x-\xi)/v_h)]h_h(\xi;x,s)d\xi$$

In the above recursive equations, $h_e(\xi;x,s)$ and $h_h(\xi;x,s)$ are the age-dependent probability density functions of the free-path-distance, $d_{fp}$, of the first ionization position due to an electron and hole, respectively, positioned at x and of age s. These density functions are new as they capture the dependence on the dynamic field. Specifically, they are given by $$h_e(\xi;x,s) = \begin{cases} \alpha(\xi, s+(\xi-x)/v_e) \exp\left\{-\int_{x+d_e(x)}^{\xi} \alpha(\sigma, s+(\sigma-x)/v_e)d\sigma\right\}, & \xi \geq x + d_e(x) \\ 0, & \text{otherwise} \end{cases}$$

and $$h_h(\xi;x,s) = \begin{cases} \beta(\xi, s+(x-\xi)/v_h) \exp\left\{-\int_{\xi}^{x-d_e(x)} \beta(\sigma, s+(x-\sigma)/v_h)d\sigma\right\}, & \xi \leq x - d_h(x) \\ 0, & \text{otherwise} \end{cases}$$

where, $\alpha(x,s)$ ($\beta(x,s)$) is the electron (hole) time-varying non-localized ionization coefficient associated with location x in the multiplication region and at time s since the launch of the electric field for an electron (hole) that has already traveled the dead space. It is given by $\alpha(x,s) = A \exp(-[E_c/E(x;s)]^m)$. The material-specific constants A, $E_c$, and m, are known for various III-V materials. The two coupled equations can then be solved numerically using an iterative approach. An example iterative approach is provided in M. M. Hayat, and B. E. A. Saleh, "Statistical properties of the impulse response function of double carrier multiplication avalanche photodiodes including the effect of dead space," IEEE J. Lightwave Technol., vol. 10, pp. 1415-1425, 1992. The mean impulse-response function, i(t,s), (in the case of a hole injection to the multiplication region at x=0) is then obtained using $i(t,s)=i_h(t,0,s)$.

In digital communications, photons arrive randomly with the duration of a bit. As a result in digital communications, the appropriate quantity would be the photon-arrival-time averaged (PATA) impulse-response function (previously introduced), which can be obtained through $i_{PATA}(t)=\int_0^T i(t,s) p_{ph}(s)ds$, where $p_{ph}(s)$ is the probability density of photons within a bit of duration T, which is governed by the intensity profile of the received optical pulse within the optical bit. This is the relevant impulse-response function in the context of an integrate-and-dump receiver with a periodically modulated electric field. By calculating the 3 dB bandwidth of the Fourier transform of $i_{PATA}(t)$, the bandwidth of the DBE-APD device can be obtained. Proof-of-concept time-response results shown with respect to FIG. 3, for example, were derived based on the techniques described here.

In various embodiments, a generalization of a modified dead-space multiplication model (MDSMT) modified to include time-varying fields can be implemented with respect to dynamic biasing schemes for optoelectronic devices. MDSMT is an analytical model, which enables the correct prediction of the gain and the excess noise factor for arbitrary heterostructure APDs under static electric fields. See, for example, M. M. Hayat, O-H. Kwon, S. Wang, J. C. Campbell, B. E. A. Saleh, and M. C. Teich, "Boundary effects on multiplication noise in thin heterostructure avalanche photodiodes," IEEE Trans. Electron Devices, vol. 49, pp. 2114-2123, December 2002.

The generalized MDSMT recurrence theory including time-varying fields can be applied for the mean gain and the excess noise factor, which is outlined in the following. As before, it is assumed that at time t=0 a dynamic and spatially nonuniform electric field E(t,x) is launched in the multiplication region of an APD. Assume that a parent carrier is created in the multiplication region at location x with an age s. Z(x,s) is defined as the totality of all offspring electrons and holes initiated by an electron injected at location x with age s. Similarly, Y(x,s) is the same as Z but with the initialing parent electron replaced by a parent hole. A renewal argument is invoked to obtain the following pair of recursive equations for the mean of the quantities Z(x,s) and Y(x,s), denoted by z(x,s) and y(x,s), respectively:

$$z(x,s)=\int_x^\infty h_e(\xi;x,s)d\xi+\int_x^\infty [2z(\xi,s+(\xi-x)/v_e)+y(\xi,s+(\xi-x)/v_e)]h_e(\xi;x,s)d\xi$$

and $$y(x,s)=\int_x^\infty h_h(\xi;x,s)d\xi+\int_0^x [2y(\xi,s+(\xi-x)/v_h)+z(\xi,s+(\xi-x)/v_h)]h_h(\xi;x,s)d\xi$$

The age-dependent multiplication factor, m(x,s), can be calculated using $m(x,s)=0.5[z(x,s)+y(x,s)]$, and the PATA mean is $m_{PATA}(x)=\int_0^T m(x,s)p_{ph}(s)ds$. Note that in the case of edge injection of a hole at x=0, the PATA gain is simply $m_{PATA}(0)$.

A recursive equation for the second moments of Z(x,s) and Y(x,s) may be derived. Following the renewal-theory approach and the age-dependent formulation described herein, and the PATA excess noise factor may be obtained using the second moments of Z(x,s) and Y(x,s). In addition, to facilitate the calculation of receiver sensitivity in a communications apparatus using the analytical model for receiver sensitivity, the PATA joint probability distribution function of the gain and the buildup time may be computed as a generalization of the formulation to time-varying electric fields.

Modeling and optimization of components for dynamic biasing may be implemented in various computational formats. For example, algorithms may be generated using high performance FORTRAN. The modeling may include solving multidimensional recursive equations, which can be both memory and CPU intensive. In order to optimize the memory usage for high accuracy calculations, a serial code can be used that allows the multidimensional recursive equations to be solved sequentially (in blocks of time t) in multiple separate parts, one part for each block of time. The accuracy of the calculations may be increased by increasing the total size of three-dimensional (3D) arrays generated by solving the multidimensional recursive equations. In this effort, the desired total size of the 3D arrays can be determined beforehand. Then, the execution of the code can be divided in several parts in which each part will calculate a section of the 3D arrays. Therefore, the memory required for the execution of an individual part of the code will be the memory to store the calculated section. Consequently, the numbers of parts in which the executable code is divided can depend on the size of the larger section of the 3D arrays that can be stored in memory. Every part of the code execution can use data calculated in the previous part and it can save data for the calculation of the next part.

In various embodiments, an optimal design of dynamic bias for an application can be generated using a machine analysis. A parametric approach can be arranged to perform a systematic study to identify the bias schemes that are most amenable to GBP enhancement. A systematic study can include analyzing bias signals of various formats such as sinusoidal, sawtooth, triangular, and other non-constant formats. For each candidate realizable shape, such as but not limited to sinusoidal, sawtooth, triangular, and other non-constant formats, parameters can be assigned that govern the amount of swing in the reverse bias, the dc value, as well as phase shift with respect to a recovery clock. The analytical model for the GBP can then be used to optimize over this parameter space for each bias shape.

The accuracy of the implementation of a dynamic bias scheme depends upon the shape of the dynamic bias. For example, periodic functions that possess abrupt changes, such as the rectangular bias scheme, are difficult to implement accurately. It is therefore important to understand the sensitivity of the GBP enhancement to errors and perturbations resulting from the implementation of the bias function. To this end, the effects of rounding and accentuating edges can be systematically analyzed, as well as other non-ideal effects such as fluctuations in the amplitude of the bias, bias phase misalignment and skew, bias jitter and phase noise and clock-synchronization errors, as well as bias waveform distortion. Bias waveforms can be identified that are most robust in the presence of non-idealities and implementation uncertainties. An appropriate bias waveform can be selected from the bias waveforms analyzed.

In various embodiments, a machine analysis applying models as discussed herein can be conducted to perform a device-structure optimization for enhanced GBP performance. Models as discussed herein can be used to optimize the field-gradient (in space) in the multiplication region of an APD to maximize the GBP. To facilitate this optimization, a parametric model for field gradient can be used in which linear, quadratic and higher order models for the gradient can be considered. Once the best field spatial profile is identified, doping, using appropriate doping techniques, can be used to implement the field gradient. To verify that the desired field gradient has been achieved, the T-CAD Sentaurus simulation platform can be used in conjunction with profilometer and SEM measurements to calculate the field profile.

As an example, for InGaAs APDs with heterostructure multiplication region consisting of two InAlGaAs and InAlAs layers, the theoretical model can be employed to optimize the widths of the InAlAs and InAlGaAs layers to maximize the GBP. The predicted excess noise factor may also be calculated as a function of the heterostructure geometry. Receiver sensitivity can be calculated at various bit rates (10 GHz-60 GHz) using a receiver sensitivity model, as is known to those skilled in the art. For example, a receiver sensitivity model can be employed in a manner as discussed in D. S. G. Ong, J. S. Ng, M. M. Hayat, P. Sun, and J. P. R. David, "Optimization of InP APDs for High Speed Lightwave Systems," *IEEE J. Lightwave Technol.*, vol. 27, pp. 3294-3302, 2009. To benchmark the performance, the excess noise factor and receiver sensitivity can be calculated in the constant bias scheme and, in comparison, enhancement provided by the dynamic biasing approach characterized. Optimization of elements of a dynamic biasing scheme can be conducted on an individual basis. A joint optimization can be performed over the entire parameter spaces encompassing the field gradient, the heterostructure geometry, and the dynamic biasing characteristics.

Figure 8:
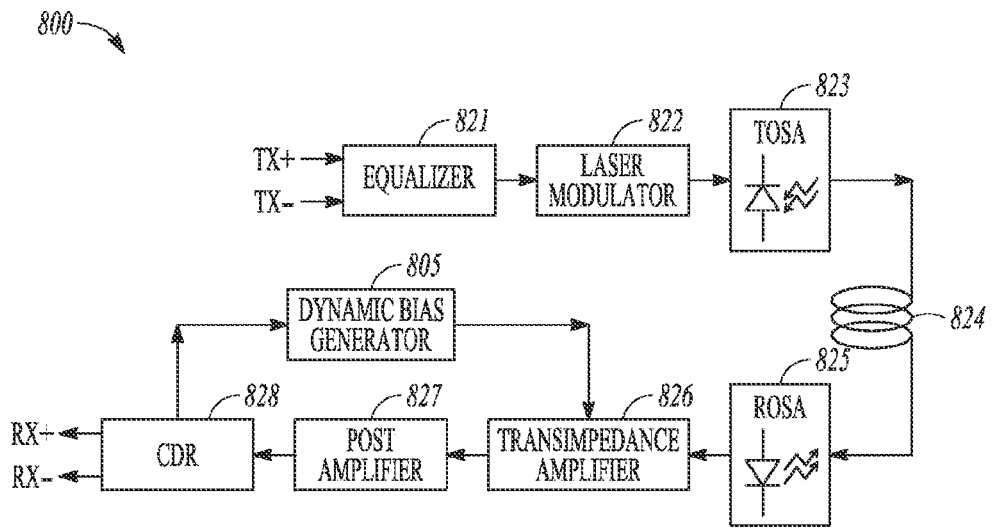
FIG. 8 shows a functional block diagram of an optical transceiver using an example dynamic-biased-enhanced avalanche photodiode diode, in accordance with various embodiments.
Figure 9:
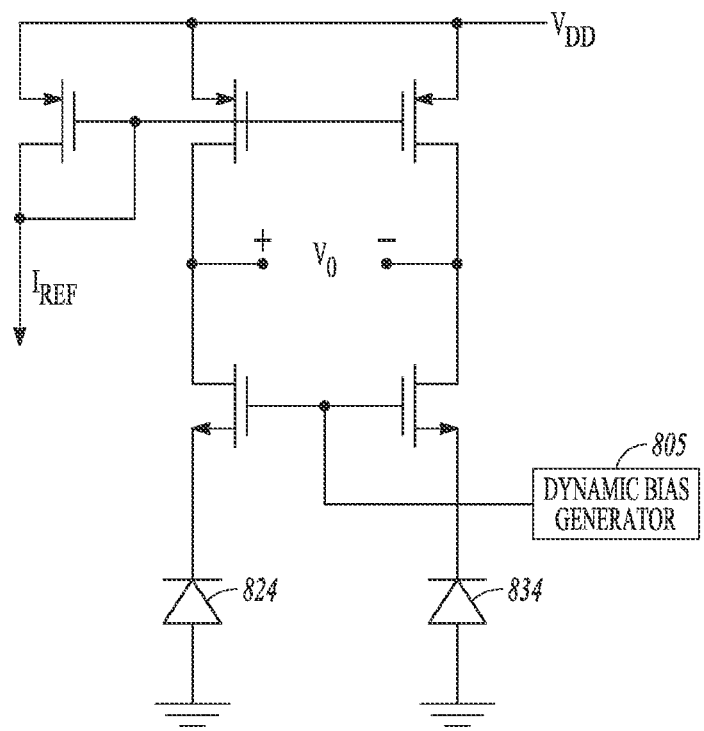
FIG. 9 shows an input stage of a differential transimpedance amplifier utilizing common mode signaling to eliminate dynamic bias signal injection, in accordance with various embodiments.

In various embodiments, a DBE-APD implementation can be directed to an APD specifically designed for the implementation. Alternatively, an example DBE-APD implementation can be directed to an off-the-shelf APD, for example a DBE-APD implementation with off-the-shelf InGaAs—InP APD. FIG. 8 shows a functional block diagram of an optical transceiver 800 using an example dynamic-biased-enhanced avalanche photodiode diode. Optical transceiver 800 can use an off-the-shelf telecom InP APD or a custom-designed APD. FIG. 9 shows an input stage of a differential transimpedance amplifier utilizing common mode signaling to eliminate dynamic bias signal injection that can be used in optical transceiver 800 of FIG. 8. Optical transceiver 800 using either the off-the-shelf telecom InP APD or the custom-designed APD demonstrates the impact of DBE-APD in optical communication systems. The transceivers of FIGS. 8 and 9 can be based on a full-duplex serial electrical and serial optical link at the standard rate of 40 Gbps.

Optical transceiver 800 can include an equalizer 821, a laser modulator 822, a transmitter optical subassembly (TOSA) 823, an optical fiber 824, a receiver optical subassembly (ROSA) 825, a transimpedance amplifier 826, a post amplifier 827, a receiver clock/data recovery (CDR) circuit 828, and a dynamic bias generator 805. The transmitter path can convert serial NRZ electrical data to a standard compliant optical signal. The differential input signal (TX+ and TX−) pass through a signal conditioner 821 with equalization that compensates for losses and deterministic noise on the input data stream. The conditioned and clean data is then sent to the modulator driver 822, which transforms the small-swing digital voltage to an output modulation that drives the laser through the TOSA 823. The laser is coupled to a single-mode optical fiber 824 through an industry standard LC optical connector. Optical fiber 824 is representative of an optical medium for coupling to an optical network for transmission from optical transceiver 800.

The receiver path can convert the incoming DC-balanced, serial NRZ optical data into a serial electrical data utilizing an embodiment of a dynamic bias enhanced technique. Optical fiber 824 is also representative of an optical medium for coupling to an optical network for reception of light in optical transceiver 800. The incoming light is coupled to an APD from the single-mode optical fiber 824 through ROSA 825. The photocurrent from the APD photodetector of ROSA 825 can be converted into a voltage by transimpedance amplifier 826 and then amplified by a post-amplifier circuit 826. However, unlike conventional receivers, the bias of the APD is dynamically changed. Dynamic bias generator 820 uses an extracted clock from the CDR circuit 828 to synchronize the bias with incoming data stream. The CDR circuit 828 generates a clock that is at the same frequency as the incoming data bit rate. This clock can be phase aligned by a phase-locked loop (PLL) that samples the data in the center of a data eye pattern. Dynamic bias generator circuit 805 uses the main clock to synchronously vary the APD bias for performance enhancement. Care should be taken in designing the transimpedance amplifier, since the dynamic bias signal may get injected into the amplification path and wipeout the weak photo current signal. To eliminate the bias signal injection into transimpedance amplifier 826, a fully differential transimpedance amplifier can be implemented (FIG. 9), where the dynamic bias in applied equally on the DBE-APD 824 and a dummy APD 834. As a result, the dynamic bias, which is a common-mode signal, can be eliminated via the differential output voltage, $V_o$, as shown in FIG. 9.

Figure 10:
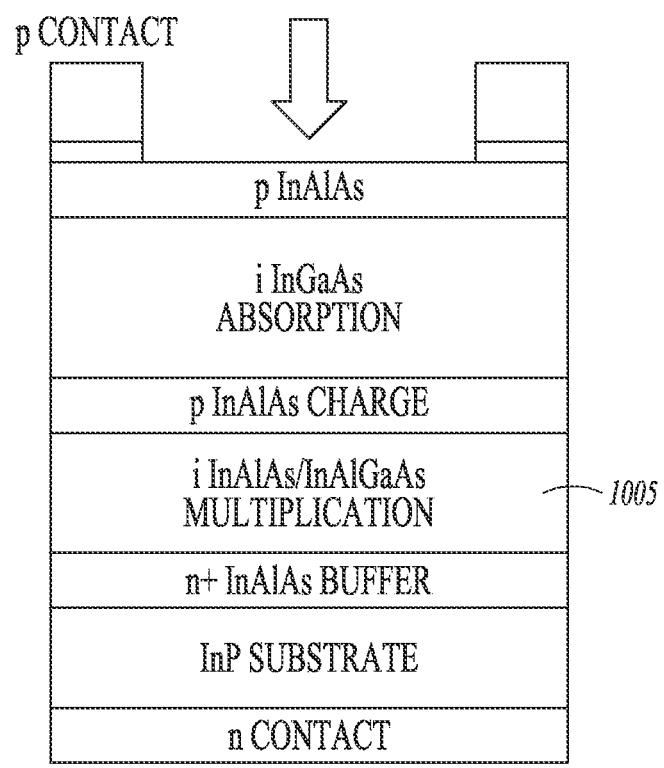
FIG. 10 shows a schematic of an example indium phosphide based avalanche photodiode diode with heterostructure multiplication region, in accordance with various embodiments.

FIG. 10 shows an APD with separate, absorption, charge, and multiplication regions (SACM) structure. Multiplication regions 1005 can include typical structures having one or more of an InAlAs region and an InAlAs/InAlGaAs heterostructure. The heterostructure can be structured, through the thickness of the individual layers, to benefit the GBP enhancement caused by the dynamic biasing. The widths of the InAlAs and InAlGaAs layers of the multiplication region can be chosen according to guidelines provided by the theoretical optimizations implemented according to processes discussed herein.

A process to select appropriate structures for optoelectronic devices and dynamic biasing of these devices can include simulating different heterostructures to optimize the electric field profile; growing a series of APDs using different doping profiles to effect the field-gradient properties as determined from analysis using theoretical optimizations as discussed herein; fabricating a family of APDs parameterized by the width of the multiplication region over a selected range of widths; perform device characterization of each of the APDs developed including I-V characteristics (under a constant bias), dark current, gain, quantum efficiency, breakdown voltage and excess noise factor; and benchmarking performance against commercial APDs. For example, such a procedure can begin with simulating different heterostructures with InGaAs absorbers and InAlAs/InAlGaAs absorbers using a T-CAD Sentaurus platform to optimize the electric field profile. A series of APDs can be grown using different doping profiles to affect the field-gradient properties as directed from analysis implementing example theoretical optimization as discussed herein. A family of InGaAs/InAlAs and InGaAs/InAlAs/InAlGaAs APDs parameterized by the width of the multiplication region ranging from 150 nm to 200 nm can then be fabricated. After forming theses APDs, the procedure can include performing device characterization of each of the APDs developed including I-V characteristics (under a constant bias), dark current, gain, quantum efficiency, breakdown voltage and excess noise factor. The performance of these fabricated APDS can be benchmarked against commercial APDs such as commercial InP APDs tested and characterized in a similar fashion as the fabricated custom APDs.

Figure 11C:
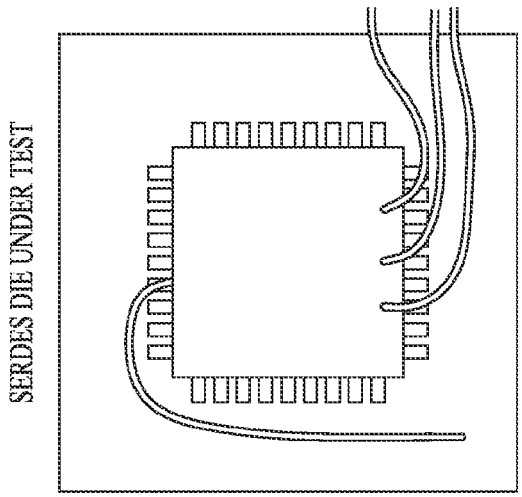
FIGS. 11A-C show a serializer/deserializer module, in accordance with various embodiments.
Figure 11B:
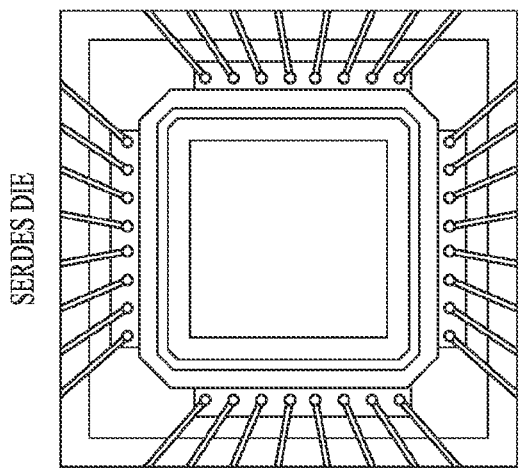
Figure 11A:
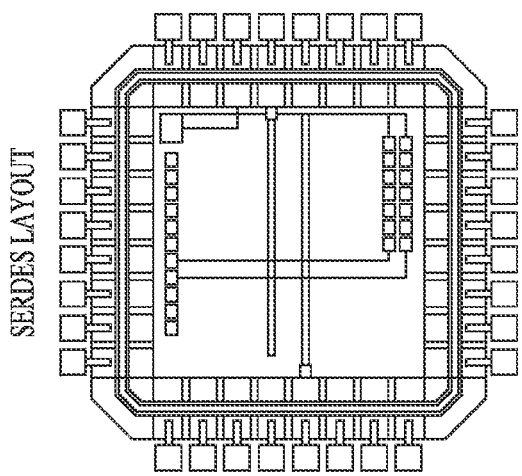

FIGS. 11A-C show a serializer/deserializer (SERDES) module. An example SERDES testchip was fabricated using 0.5 um ON semiconductor manufacturing process through a fabrication service provider. FIG. 11A shows the testchip layout. FIG. 11B shows the die of the SERDES with couplings for external connection. FIG. 11C shows a test board for the SERDES. This custom designed SERDES can be utilized to interface an optical transceiver to a desktop computer for overall data transmission test, bit error rate, and maximum data rate measurements.

Figure 12A:
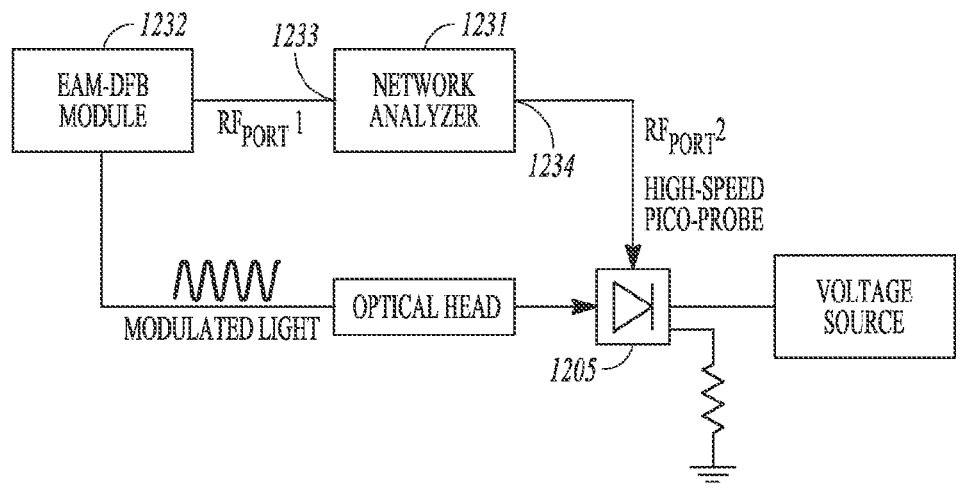
FIG. 12A-B show schematic diagrams of frequency and time domain measurement setups, in accordance with various embodiments.
Figure 12B:
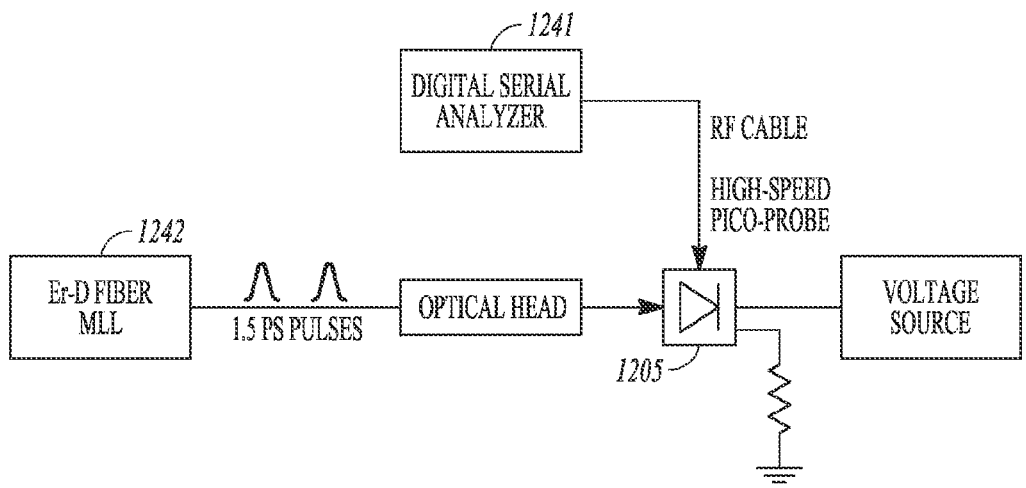

FIGS. 12A-B show schematic diagrams of frequency and time domain measurement setups. FIG. 12A shows a schematic diagram of frequency domain measurement setup that includes APD 1205, network analyzer 1231 having a first port 1233 and a second port 1234, and an electro-absorption modulated DFB laser 1232. The frequency response of APD 1205 can be measured on a 40 GHz network analyzer 1231 using an electro-absorption modulated DFB laser 1232 as a calibrated light source on first port 1233. This particular emitter operates at a wavelength of 1550 nm, has a very flat small-signal response across the desired frequency range, and up to 10 mW optical output power. On the receiver end, APD 1205 itself can be fabricated in a low parasitic package that permits on-wafer microwave probing up to 40 GHz and connection to second port 1234 of GHz network analyzer 1231.

FIG. 12B shows a schematic diagram of a time domain measurement setup that includes APD 1205, a 1550 nm erbium-doped fiber mode-locked laser 1242, and a digital serial analyzer 1241. For time domain measurements, 1550 nm erbium-doped fiber mode-locked laser 1242 can be used to generate 1.5 ps pulses and connect the on-wafer probed APD 1205 to digital serial analyzer 1241 with a 70 GHz bandwidth electrical sampling module. These measurements are particularly useful for elucidating the fast/slow time responses in the APDs and for crosschecking the frequency response behavior with its time domain transform.

Figure 13:
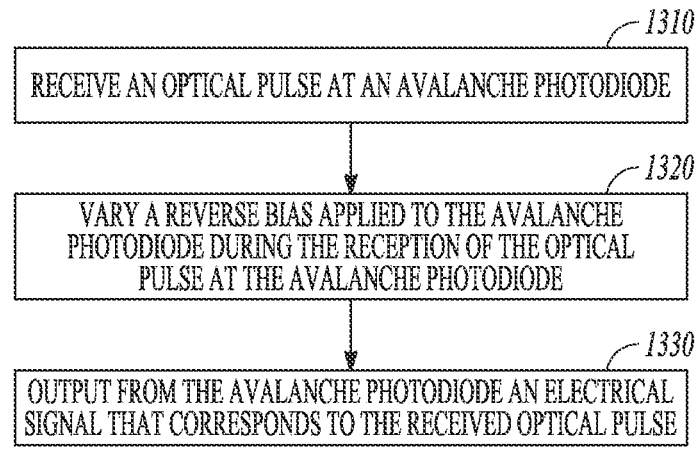
FIG. 13 shows features of an example method of operating an optoelectronic device, in accordance with various embodiments.

FIG. 13 shows features of an example embodiment of a method 1300 of operating an optoelectronic device. System 1300 may include one or more features of methods with respect to other figures and methods as discussed herein. At 1310, an optical pulse is received at an avalanche photodiode. An optical pulse can be received at an avalanche photodiode in linear mode or equivalent below-breakdown mode. Receiving the optical pulse at the avalanche photodiode can include receiving an optical pulse at an InP avalanche photodiode. Receiving the optical pulse at the avalanche photodiode can include receiving an optical pulse at an avalanche photodiode having a multiplication region containing an InAlAs—InAlGaAs heterostructure. Other materials may be used for the construction of the avalanche photodiode. At 1320, a reverse bias applied to the avalanche photodiode is varied during the reception of the optical pulse at the avalanche photodiode. Varying the reverse bias can include varying voltage applied to the avalanche photodiode from a high voltage to a low voltage. Varying the reverse bias may include applying a sinusoidal waveform. Varying the reverse bias may include applying a sawtooth waveform. Varying the reverse bias may include applying a triangular waveform. Varying the reverse bias may include applying other non-constant waveforms. At 1330, an electrical signal that corresponds to the received optical pulse is output from the avalanche photodiode.

Figure 14:
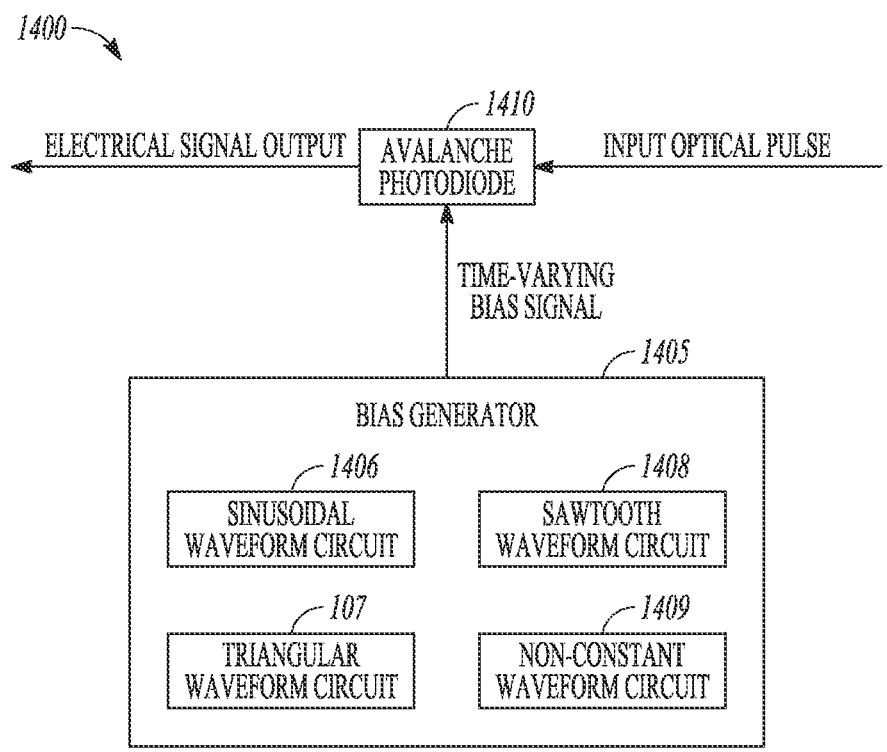
FIG. 14 shows an example system including an optoelectronic device, in accordance with various embodiments.

FIG. 14 shows an example embodiment of a system 1400 including an optoelectronic device. System 1400 may include one or more features of components with respect to other figures and methods as discussed herein. System 1400 can include an avalanche photodiode 1410 and a bias generator 1405 coupled to avalanche photodiode 1410. Avalanche photodiode 1410 can be arranged to receive an optical pulse from an optical medium and to output an electrical signal that corresponds to the received optical pulse. Avalanche photodiode 1410 can be arranged in linear mode or equivalent below-breakdown mode to receive an optical pulse from an optical medium and to output an electrical signal that corresponds to the received optical pulse. Avalanche photodiode 1410 can include an InP avalanche photodiode. Avalanche photodiode 1410 can include an avalanche photodiode having a multiplication region containing an InAlAs—InAlGaAs hetero structure.

Bias generator 1405 can be arranged to apply a time-varying bias to avalanche photodiode 1410 such that a reverse bias applied to avalanche photodiode 1410 varies during the reception of the optical pulse at avalanche photodiode 1410. The applied time-varying bias can be a bit-synchronized time-varying bias. Bias generator 1405 can be structured to apply a reverse bias to avalanche photodiode 1410 by varying voltage applied to avalanche photodiode 1410 from a high voltage to a low voltage. Bias generator 1405 may include a sinusoidal waveform circuit 1406 structured to apply a sinusoidal waveform. Bias generator 1405 may include a sawtooth waveform circuit 1408 structured to apply a sawtooth waveform. Bias generator 1405 may include a triangular waveform circuit 1407 structured to apply a triangular waveform. Bias generator 1405 may include a non-constant waveform circuit 1409 structured to apply a non-constant waveform.

System 1400 may include a transimpedance amplifier coupled to bias generator 1405 and avalanche photodiode 1410. The transimpedance amplifier can be structured as a differential transimpedance amplifier using a dummy avalanche photodiode arranged to receive the time-varying bias as a reverse bias. For system 1400, the optical medium can include a single mode fiber such that avalanche photodiode 1410 is arranged to receive the optical pulse from the single mode fiber. The single mode fiber may be coupled to a digital communications network.

Figure 15:
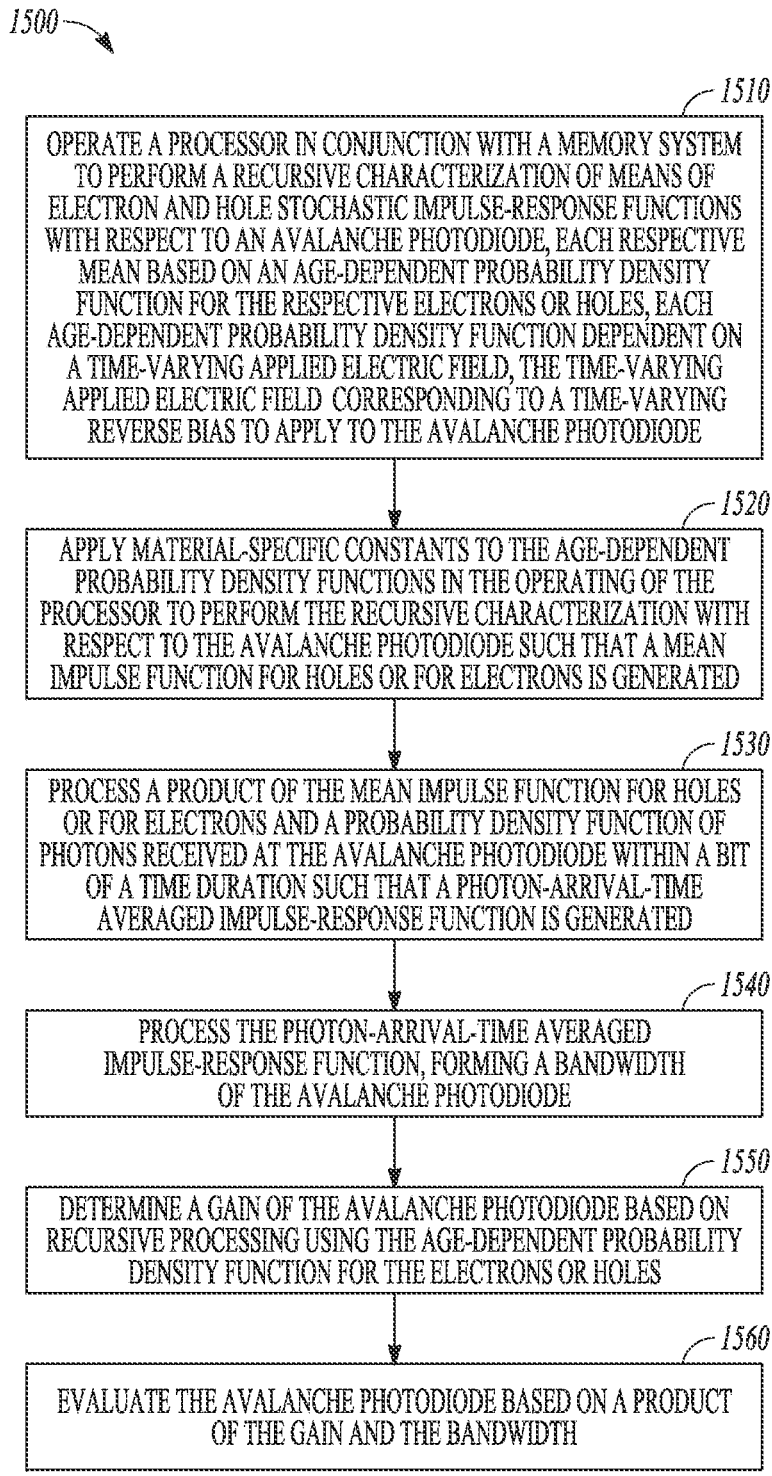
FIG. 15 features of an example method of determining a time-varying bias to be applied to an optoelectronic device, in accordance with various embodiments.

FIG. 15 shows features of an example embodiment of a method 1500 of determining a time-varying bias to be applied to an optoelectronic device. Method 1500 may include one or more features of methods with respect to other figures and methods as discussed herein. At 1510, a processor in conjunction with a memory system is operated to perform a recursive characterization of means of electron and hole stochastic impulse-response functions with respect to an avalanche photodiode under dynamic bias conditions, each respective mean based on an age-dependent probability density function for the respective electrons or holes, each age-dependent probability density function dependent on a time-varying applied electric field, each time-varying applied electric field corresponding to a time-varying reverse bias to apply to the avalanche photodiode. The time-varying applied electric field can be selected from a set of time-varying applied electric fields, where each time-varying applied electric field corresponds to a different time-varying reverse bias to apply to the avalanche photodiode. The set may include only one time-varying electric field. At 1520, material-specific constants are applied to the age-dependent probability density functions in the operating of the processor to perform the recursive characterization with respect to the avalanche photodiode such that a mean impulse function for holes or for electrons is generated.

At 1530, a product of the mean impulse function for holes or for electrons and a probability density function of photons received at the avalanche photodiode within a bit of a time duration is processed such that a photon-arrival-time averaged impulse-response function is generated. At 1540, the photon-arrival-time averaged impulse-response function is processed, forming a bandwidth of the avalanche photodiode. Processing the photon-arrival-time averaged impulse-response function, forming the bandwidth of the avalanche photodiode, can include calculating a 3 dB bandwidth of a Fourier transform of the photon-arrival-time averaged impulse-response function. At 1550, a gain of the avalanche photodiode is determined based on recursive processing using the age-dependent probability density function for the electrons or holes. At 1560, the avalanche photodiode is evaluated based on a product of the gain and the bandwidth.

Method 1500 can include, for the set having more than one time-varying applied electric field and for each time-varying applied electric field in the set, performing the operations such that a product of a gain and a bandwidth is determined for each time-varying applied electric field of the set. Method 1500 can include selecting one of the different time-varying reverse biases from the set, based on evaluation of the products of the gain and bandwidth corresponding to each reverse bias, to operatively apply to the avalanche photodiode.

Method 1500 can include replacing the material-specific constants with one or more sets of material-specific constants and repeating the operations for each set of material-specific constants forming a gain bandwidth product for each item in a combination of the set of material-specific constants and the set of time-varying reverse biases. Method 1500 can include selecting a structure of an avalanche photodiode applicable to a selected apparatus and a selecting a time-varying reverse bias applicable to the selected apparatus, the structure and time-varying reverse bias selected from the combination. Method 1500 can include selecting a structure by selecting material of a multiplication region of the avalanche photodiode. Method 1500 can include selecting a structure by selecting a thickness of a multiplication region of the avalanche photodiode.

Method 1500 can include replacing the material-specific constants with one or more sets of material-specific constants and repeating the operations for each set of material-specific constants forming a gain bandwidth product for each set of material-specific constants. Method 1500 can include selecting an avalanche photodiode for an apparatus based on a comparison of the gain bandwidth products for each set of material-specific constants.

Method 1500 can include recursive processing sequentially in blocks of time in multiple separate parts, one part for each block of time. Method 1500 can include processing using data calculated in a previous part and saving data in a current part for use in a next part.

Various components of a system can include implementations using a processor operable to determine a time-varying bias to be applied to an optoelectronic device. These implementations may include a machine-readable storage device having machine-executable instructions, such as a computer-readable storage device having computer-executable instructions, to: operate a processor in conjunction with a memory system to perform a recursive characterization of means of electron and hole stochastic impulse-response functions with respect to an avalanche photodiode, each respective mean based on an age-dependent probability density function for the respective electrons or holes, each age-dependent probability density function dependent on a time-varying applied electric field from a set of time-varying applied electric fields, each time-varying applied electric field corresponding to a different time-varying reverse bias to apply to the avalanche photodiode; to apply material-specific constants to the age-dependent probability density functions in the operating of the processor to perform the recursive characterization with respect to the avalanche photodiode such that a mean impulse function for holes or for electrons is generated; to process a product of the mean impulse function for holes or for electrons and a probability density function of photons received at the avalanche photodiode within a bit of a time duration such that a photon-arrival-time averaged impulse-response function is generated; to process the photon-arrival-time averaged impulse-response function, forming a bandwidth of the avalanche photodiode; to determine a gain of the avalanche photodiode based on recursive processing using the age-dependent probability density function for the electrons or holes; and to evaluate the avalanche photodiode based on a product of the gain and the bandwidth. The instructions can include instructions to select a time-varying bias from a number of time-varying biases to apply to an avalanche photodiode. The instructions can include instructions to select the structural properties of an avalanche photodiode, The instructions can include instructions to select the structural properties of an avalanche photodiode and to select a time-varying bias from a number of time-varying biases to apply to the avalanche photodiode. The instructions can include instructions to operate a system to analyze parameters for an avalanche photodiode and time-varying bias schemes for the avalanche photodiode such that the avalanche photodiode has an enhanced gain bandwidth product relative to conventional avalanche photodiodes biased by a constant signal in accordance with the teachings herein. For example, instructions can include instructions to perform the operations of the example method associated with FIG. 15. Further, a machine-readable storage device, herein, is a physical device that stores data represented by physical structure within the device. Examples of machine-readable storage devices include, but are not limited to, read only memory (ROM), random access memory (RAM), a magnetic disk storage device, an optical storage device, a flash memory, and other electronic, magnetic, and/or optical memory devices.

Figure 16:
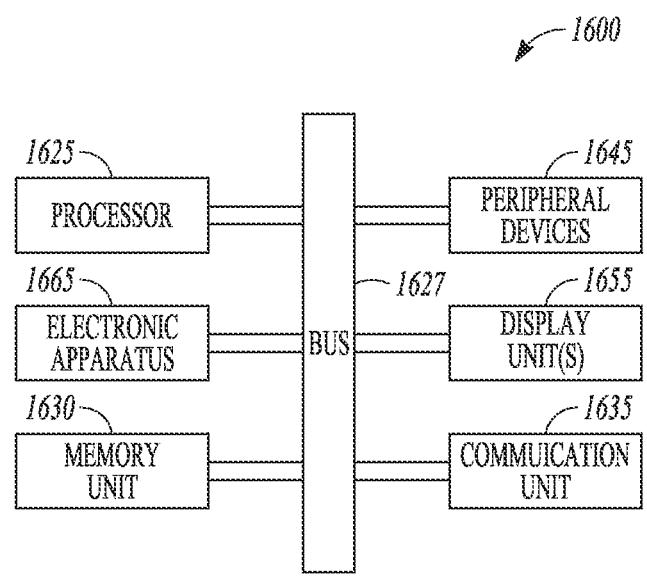
FIG. 16 an example system operable to determine a time-varying bias to be applied to an optoelectronic device, in accordance with various embodiments.

FIG. 16 shows an example embodiment of a system 1600 operable to determine a time-varying bias to be applied to an optoelectronic device. System 1600 may include one or more features of components with respect to other figures and methods as discussed herein. System 1600 can include a processor 1625, a memory unit 1630, a bus 1627, an electronic apparatus 1665, peripheral devices 1645, display unit(s) 1655, and communication unit 1635. In an embodiment, processor 1625 can be realized as a processor or a group of processors that may operate independently depending on an assigned function. Memory unit 1630 can include one or more memory devices.

Memory unit 1630 can include instructions stored thereon to operate according to algorithms and techniques discussed herein including, but not limited to, the methods associated with FIG. 15. Memory unit 1630 can have instructions stored thereon, which when executed by processor 1625, cause the system 1600 to perform operations to operate a processor in conjunction with a memory system to perform a recursive characterization of means of electron and hole stochastic impulse-response functions with respect to an avalanche photodiode, each respective mean based on an age-dependent probability density function for the respective electrons or holes, each age-dependent probability density function dependent on a time-varying applied electric field from a set of time-varying applied electric fields, each time-varying applied electric field corresponding to a different time-varying reverse bias to apply to the avalanche photodiode; to apply material-specific constants to the age-dependent probability density functions in the operating of the processor to perform the recursive characterization with respect to the avalanche photodiode such that a mean impulse function for holes or for electrons is generated; to process a product of the mean impulse function for holes or for electrons and a probability density function of photons received at the avalanche photodiode within a bit of a time duration such that a photon-arrival-time averaged impulse-response function is generated; to process the photon-arrival-time averaged impulse-response function, forming a bandwidth of the avalanche photodiode; to determine a gain of the avalanche photodiode based on recursive processing using the age-dependent probability density function for the electrons or holes; and to evaluate the avalanche photodiode based on a product of the gain and the bandwidth. The instructions can include instructions to select a time-varying bias from a number of time-varying biases to apply to the avalanche photodiode. The instructions can include instructions to select the structural properties of an avalanche photodiode, The instructions can include instructions to select the structural properties of an avalanche photodiode and to select a time-varying bias from a number of time-varying biases to apply to an avalanche photodiode. The instructions can include instructions to operate a system to analysis parameters for an avalanche photodiode and time-varying bias schemes for the avalanche such that the avalanche photodiode has an enhance gain bandwidth product relative to conventional avalanche photodiodes biased by a constant signal in accordance with the teachings herein. For example, instructions can include instructions to perform the operations of the example method associated with FIG. 15. Further, a machine-readable storage device, herein, is a physical device that stores data represented by physical structure within the device. Examples of machine-readable storage devices include, but are not limited to, read only memory (ROM), random access memory (RAM), a magnetic disk storage device, an optical storage device, a flash memory, and other electronic, magnetic, and/or optical memory devices. Memory unit 1630 can be realized as any type of storage device. Memory unit 1630 provides a machine-readable storage medium, which can have instructions stored thereon such that when the instructions are executed by processor 1625, system 1600 can perform operations such as determining a time-varying bias for an avalanche photodiode and determining an appropriate avalanche photodiode for enhanced operation according to the teachings herein.

Bus 1607 can provide electrical conductivity among the components of system 1600. Bus 1607 can include an address bus, a data bus, and a control bus, each independently configured. Bus 1607 can be realized using a number of different communication mediums that allows for the distribution of components of system 1600. Use of bus 1607 can be regulated by processor 1625.

Display units 1645 can be arranged to provide a user interface to input parameters for the processing performed by system 1600 using various algorithms and techniques as taught herein. In various embodiments, electronic apparatus 1635 can include additional display units, additional storage memory, and/or other control devices that may operate in conjunction with processor 1625 and/or memory 1630.

Although specific embodiments have been illustrated and described herein, it will be appreciated by those of ordinary skill in the art that any arrangement that is calculated to achieve the same purpose may be substituted for the specific embodiments shown. Upon studying the disclosure, it will be apparent to those skilled in the art that various modifications and variations can be made in the devices and methods of various embodiments of the invention. Various embodiments can use permutations and/or combinations of embodiments described herein. Other embodiments will be apparent to those skilled in the art from consideration of the specification and practice of the embodiments disclosed herein. It is to be understood that the above description is intended to be illustrative, and not restrictive, and that the phraseology or terminology employed herein is for the purpose of description.

What is claimed is:

1. A method comprising:
receiving a set of optical pulses at an avalanche photodiode in linear mode or equivalent below-breakdown mode, each optical pulse having a beginning and an end;
varying a reverse bias applied to the avalanche photodiode during the reception of each optical pulse at the avalanche photodiode, the reverse bias having a highest reverse bias level and a lowest reverse bias level during the reception of each optical pulse such that the highest reverse bias level is placed within a first half of each optical pulse received and the lowest reverse bias level is placed within a second half of each optical pulse eliminating impact ionizations in the avalanche photodiode near the end of each optical pulse received; and
outputting from the avalanche photodiode an electrical signal that corresponds to the received optical pulse.

2. The method of claim 1, wherein varying the reverse bias includes varying the reverse bias with respect to a first half and a second half of a bit period of each optical pulse such that eliminating impact ionizations occurs in the second half containing the end of the optical pulse.

3. The method of claim 1, wherein varying the reverse bias includes applying a sinusoidal waveform.

4. The method of claim 1, wherein varying the reverse bias includes applying a sawtooth waveform.

5. The method of claim 1, wherein varying the reverse bias includes apply a triangular waveform.

6. The method of claim 1, wherein receiving the optical pulse at the avalanche photodiode includes receiving an optical pulse at an InP avalanche photodiode.

7. The method of claim 1, wherein receiving the optical pulse at the avalanche photodiode includes receiving an optical pulse at an avalanche photodiode having a multiplication region containing an InAlAs—InAlGaAs heterostructure.

8. A system comprising:
an avalanche photodiode arranged in linear mode to receive a set of optical pulses from an optical medium, each optical pulse having a beginning and an end, the avalanche photodiode arranged to output an electrical signal that corresponds to the received set of optical pulses; and
a bias generator coupled to the avalanche photodiode, the bias generator arranged to apply bit-synchronized time-varying bias to the avalanche photodiode such that a reverse bias applied to the avalanche photodiode varies during the reception of the optical pulse at the avalanche photodiode, the reverse bias having a highest reverse bias level and a lowest reverse bias level during the reception of each optical pulse such that the highest reverse bias level is placed within a first half of each optical pulse received and the lowest reverse bias level is placed within a second half of each optical pulse to eliminate impact ionizations in the avalanche photodiode near the end of each optical pulse received.

9. The system of claim 8, wherein bias generator is structured to apply a reverse bias to the avalanche photodiode that varies with respect to a first half and a second half of a bit period of each optical pulse such that elimination of impact ionizations in the avalanche photodiode occurs in the second half containing the end of the optical pulse.

10. The system of claim 8, wherein the bias generator includes a waveform circuit structured to apply a sinusoidal waveform.

11. The system of claim 8, wherein the bias generator includes a waveform circuit structured to apply a sawtooth waveform.

12. The system of claim 8, wherein the bias generator includes a waveform circuit structured to apply a triangular waveform.

13. The system of claim 8, wherein the avalanche photodiode includes an InP avalanche photodiode.

14. The system of claim 8, wherein the avalanche photodiode includes an avalanche photodiode having a multiplication region containing an InAlAs—InAlGaAs hetero structure.

15. The system of claim 8, wherein the system includes a transimpedance amplifier coupled to the bias generator and the avalanche photodiode.

16. The system of claim 15, wherein the transimpedance amplifier is structured as a differential transimpedance amplifier using a dummy avalanche photodiode, in addition to the avalanche photodiode, arranged to receive the time-varying bias as a reverse bias that is applied to the avalanche photodiode to partially or fully cancel or offset the time-varying bias that goes through the avalanche photodiode that would otherwise be present in the electrical signal output.

17. The system of claim 8, wherein the optical medium includes a single mode fiber such that the avalanche photodiode arranged to receive an optical pulse from the single mode fiber.

18. The system of claim 17, wherein the single mode fiber is coupled to a digital communications network.

19. The system of claim 8, wherein characteristics of the bit-synchronized time-varying bias are selected to provide a maximal gain bandwidth product, lowest determined receiver bit-error rate, and best determined receiver sensitivity.

* * * * *